(12) United States Patent
Kaga et al.

(10) Patent No.: US 8,399,863 B2
(45) Date of Patent: Mar. 19, 2013

(54) CHARGED PARTICLE BEAM APPARATUS USING AN ELECTROSTATIC LENS GUN

(75) Inventors: Hiroyasu Kaga, Mito (JP); Masashi Sasaki, Mito (JP); Junzo Azuma, Hitachiohta (JP)

(73) Assignee: Hitachi High-Technologies Corporation, Tokyo (JP)

( * ) Notice: Subject to any disclaimer, the term of this patent is extended or adjusted under 35 U.S.C. 154(b) by 7 days.

(21) Appl. No.: 13/058,137

(22) PCT Filed: Jul. 23, 2009

(86) PCT No.: PCT/JP2009/063204
§ 371 (c)(1),
(2), (4) Date: Apr. 25, 2011

(87) PCT Pub. No.: WO2010/016394
PCT Pub. Date: Feb. 11, 2010

(65) Prior Publication Data
US 2011/0186745 A1 Aug. 4, 2011

(30) Foreign Application Priority Data

Aug. 8, 2008 (JP) ................................. 2008-206388

(51) Int. Cl.
*H01J 27/26* (2006.01)
*H01J 37/08* (2006.01)
(52) U.S. Cl. ........... 250/492.21; 250/423 R; 250/396 R; 250/424; 250/492.1; 250/492.3; 315/111.81
(58) Field of Classification Search .............. 250/423 R, 250/396 R, 424, 492.21; 315/111.81
See application file for complete search history.

(56) References Cited

U.S. PATENT DOCUMENTS 3,927,321 A * 12/1975 Welter ........................... 250/310
4,521,719 A * 6/1985 Liebel ...................... 315/111.81
(Continued)

FOREIGN PATENT DOCUMENTS

JP 63-141247 6/1988
JP 2005-063865 3/2005
(Continued)

OTHER PUBLICATIONS

English Translation of the International Preliminary Report on Patentability and Written Opinion of the International Searching Authority, issued in the International Patent Application No. PCT/JP2009/063204, mailed on Jul. 23, 2009.

*Primary Examiner* — David A Vanore
(74) *Attorney, Agent, or Firm* — McDermott Will & Emery LLP

(57) ABSTRACT

A charged particle gun includes: a charged particle source; a first extracting electrode arranged in such a manner that a distance between the charged particle source and the first extracting electrode is fixed; a second extracting electrode located on the side opposite to the charged particle source with respect to the first extracting electrode, the electrode being arranged in such a manner that a distance between the first extracting electrode and the second extracting electrode is adjustable; and an earth electrode located on the side opposite to the first extracting electrode with respect to the second extracting electrode, the electrode being arranged in such a manner that a distance between the second extracting electrode and the earth electrode is fixed; wherein the first extracting electrode is equal in potential to the second extracting electrode.

5 Claims, 15 Drawing Sheets

U.S. PATENT DOCUMENTS

| | | | | |
|---|---|---|---|---|
| 4,580,058 A | * | 4/1986 | Mears et al. | 250/396 R |
| 4,814,716 A | * | 3/1989 | Kato et al. | 315/111.81 |
| 5,583,344 A | * | 12/1996 | Mizumura et al. | 250/492.21 |
| 5,825,035 A | * | 10/1998 | Mizumura et al. | 250/423 R |
| 5,969,366 A | * | 10/1999 | England et al. | 250/492.21 |
| 6,501,078 B1 | * | 12/2002 | Ryding et al. | 250/423 R |
| 7,176,454 B2 | * | 2/2007 | Hayden et al. | 250/288 |
| 7,235,798 B2 | * | 6/2007 | Ishitani et al. | 250/492.21 |
| 7,271,399 B2 | * | 9/2007 | Bong et al. | 250/492.21 |
| 7,420,181 B2 | * | 9/2008 | Kaga et al. | 250/423 R |
| 7,804,073 B2 | * | 9/2010 | Kaga et al. | 250/423 R |
| 7,842,931 B2 | * | 11/2010 | Satoh et al. | 250/423 R |
| 7,872,242 B2 | * | 1/2011 | Boswell et al. | 250/424 |
| 7,915,597 B2 | * | 3/2011 | Huang et al. | 250/396 R |
| 7,956,336 B2 | * | 6/2011 | Kaga | 250/492.21 |
| 2005/0127304 A1 | | 6/2005 | Kaga et al. | |
| 2011/0186745 A1 | * | 8/2011 | Kqaga et al. | 250/396 R |

FOREIGN PATENT DOCUMENTS

JP    2005-174604    6/2005

* cited by examiner (a)

Deceleration Mode (b)

Acceleration Mode (a)

| Acceleration Voltage | Beam current | | | Beam Current | | |
|---|---|---|---|---|---|---|
| 40kV | $\Delta Ve<0$ | > | $\Delta Ve>0$ | $\Delta h<0$ | < | $\Delta h>0$ |
| 5kV | $\Delta Ve<0$ | ≦ | $\Delta Ve>0$ | $\Delta h<0$ | = | $\Delta h>0$ |
| 2kV | $\Delta Ve<0$ | < | $\Delta Ve>0$ | $\Delta h<0$ | = | $\Delta h>0$ |
| 1kV | $\Delta Ve<0$ | >> | $\Delta Ve>0$ | $\Delta h<0$ | >> | $\Delta h>0$ |

US 8,399,863 B2

CHARGED PARTICLE BEAM APPARATUS USING AN ELECTROSTATIC LENS GUN

RELATED APPLICATIONS

This application is the U.S. National Phase under 35 U.S.C. §371 of International Application No. PCT/JP2009/063204, filed on Jul. 23, 2009, which in turn claims the benefit of Japanese Application No. 2008-206388, filed on Aug. 8, 2008, the disclosures of which Applications are incorporated by reference herein.

TECHNICAL FIELD

The present invention relates to a charged particle gun and a focused ion beam apparatus using the gun.

BACKGROUND ART

In recent years, samples are frequently processed using a high-energy charged particle beam (e.g., focused ion beam). For example, a known technique for finely processing a sample is as follows. A charged particle beam is extracted from a charged particle source by an extracting electrode. The extracted charged particle beam is accelerated by an earth electrode (acceleration electrode) and finely focused by a lens so that the sample is irradiated with the beam (refer to Patent Document 1 and the like).

PRIOR ART DOCUMENT

Patent Document

Patent Document 1: JP-2005-174604-A

SUMMARY OF THE INVENTION

Problem to be Solved by the Invention

In the aforementioned conventional technique, the sample is finely processed by irradiating the sample with the charged particle beam accelerated by an acceleration voltage applied by the ion source and thereby sputtering atoms that constitute a part of the sample. However, charged particle beam irradiation will form vacancies and disorder in atoms that constitute the sample. As a result, an amorphous layer may be formed on the sample surface irradiated with the charged particle beam. For example, when a charged particle beam (e.g., gallium (Ga) ion beam) of charged particles having a relatively large mass is used, an amorphous layer having a thickness of 100 Å may be formed on the sample surface (portion to be processed). The sample surface is sometimes observed with a scanning electron microscope (SEM) or the like. In such a case, if the sample surface has been covered with an amorphous layer, then the sample surface cannot be obtained in the form of a clear image, resulting in obstruction to the observation of the sample surface.

The formation of the amorphous layer can be suppressed to some extent, for example, by reducing the acceleration voltage to be applied to the charged particles and thereby reducing the energy of the charged particle beam.

However, when the acceleration voltage is reduced and then the irradiation with the charged particle beam is performed, chromatic aberration is increased at the position of the sample. Thus, the beam cannot be focused, and the accuracy of the processing may be reduced. In addition, since a beam current is reduced in proportion to the acceleration voltage, the speed at which the sample is processed may be reduced and the efficiency of the processing may be reduced.

The present invention has been devised in consideration of the aforementioned circumstances, and an object of the present invention is to provide a charged particle gun that is capable of reducing an acceleration voltage to be applied to charged particles while suppressing reductions in the accuracy and efficiency of processing a sample with a charged particle beam, and to provide a focused ion beam apparatus using the gun.

Means for Solving the Problem

In order to accomplish the object, according to the present invention, a charged particle gun includes: a charged particle source; a first extracting electrode arranged in such a manner that a distance between the charged particle source and the first extracting electrode is fixed; a second extracting electrode located on the side opposite to the charged particle source with respect to the first extracting electrode, the electrode being arranged in such a manner that a distance between the first extracting electrode and the second extracting electrode is adjustable; and an earth electrode located on the side opposite to the first extracting electrode with respect to the second extracting electrode, the electrode being arranged in such a manner that a distance between the second extracting electrode and the earth electrode is fixed; wherein the first extracting electrode is equal in potential to the second extracting electrode.

Effect of the Invention

According to the present invention, it is possible to reduce an acceleration voltage to be applied to charged particles while suppressing reductions in the accuracy and efficiency of processing with a charged particle beam.

BRIEF DESCRIPTION OF THE DRAWINGS

FIG. 16 is a diagram showing changes in the beam current when the extraction voltage Ve and the vertical position h of an ion source 1 are changed.

MODE FOR CARRYING OUT THE INVENTION

An embodiment of the present invention is described below with reference to the accompanying drawings.

(1) Entire Configuration of Focused Ion Beam Apparatus

Figure 1:
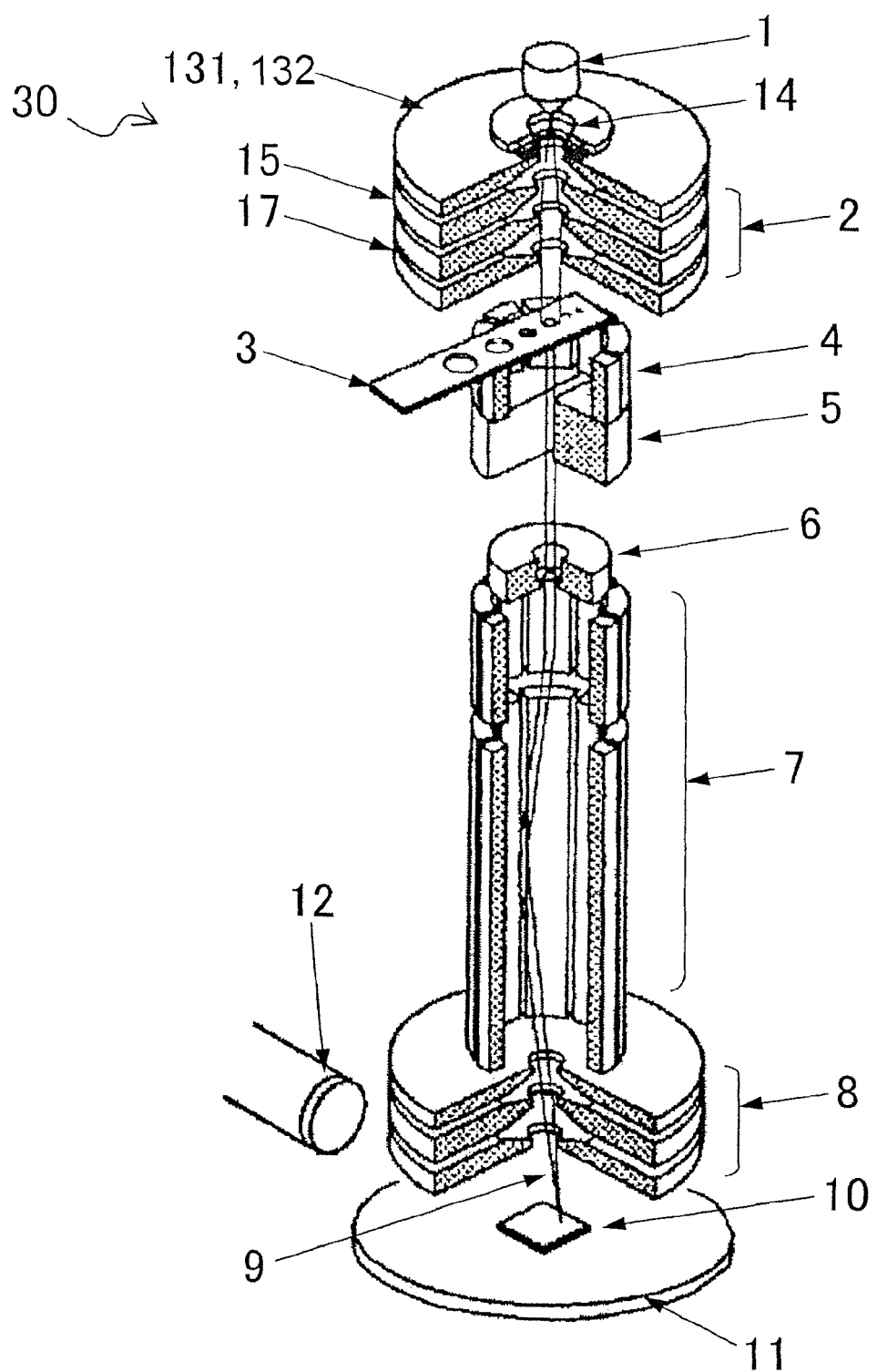
FIG. 1 is a partial cross sectional view of a focused ion beam apparatus according to an embodiment of the present invention.

FIG. 1 is a partial cross sectional view of a focused ion beam apparatus according to the present embodiment.

Referring to FIG. 1, the focused ion beam apparatus according to the present embodiment includes a charged particle gun 30, a condenser lens 2, a diaphragm device (objective aperture) 3, an aligner/stigma 4, a blanker 5, a blanking plate 6, a beam scanner 7, an objective lens 8, a sample stage 11, and a detector 12. The charged particle gun 30 includes a charged particle source 1, extracting electrodes 131, 132, a beam restricting aperture 14, an earth electrode 15, and the like. The condenser lens 2 includes multiple (for example, three) condenser electrodes 17.

The charged particle source 1 is a liquid metal ion source (LMIS) such as a gallium liquid metal ion source. The charged particle gun 30 emits a gallium ion beam (hereinafter referred to as an ion beam) as a charged particle beam 9 in a direction (downward direction in FIG. 4) toward a sample (described later). The ion beam (charged particle beam) 9 emitted by the charged particle gun 30 is subjected to a weak focusing effect by the condenser lens 2 and then incident on the diaphragm device 3.

The diaphragm device 3 is a belt-like member and is arranged on the optical axis of the ion beam (charged particle beam) 9. The diaphragm device 3 is slidable in a longitudinal direction of the diaphragm device 3 by means of a driving device (not shown). The diaphragm device 3 has multiple (for example, four) apertures (diaphragms) arranged in the longitudinal direction. The diameters of the apertures are 5 µm, 40 µm, 200 µm, and 500 µm, for example. Any of the apertures, which has a desired diameter, is arranged on the optical axis of the ion beam 9 by causing the driving device (not shown) to move the diaphragm device 3 in the longitudinal direction.

The ion beam 9 that passes through the aperture of the diaphragm device 3 passes through the aligner/stigma 4, the blanker 5, the blanking plate 6, and the beam scanner 7. Then, the ion beam 9 is focused by a focusing effect of the objective lens 8 so that the sample 10 that is placed on the sample stage 11 is irradiated with the focused ion beam 9.

The position of a point that is present on the sample 10 and irradiated with the ion beam 9 is controlled by the beam scanner 7. A signal (secondary electron) that is generated from the sample 10 due to the irradiation with the ion beam 9 is detected by the detector 12. The detected signal is transmitted from the detector 12 to a control device (not shown).

The control device (not shown) controls the beam scanner 7 using an operation signal so that the beam scanner 7 scans the surface of the sample 10 with the ion beam 9. Then, the control device synchronizes the operation signal transmitted to the beam scanner 7 with the signal detected by the detector 12 (detected signal), thereby acquires an image of the sample 10, and causes a display device (not shown) to display the image.

The charged particle gun 30 according to the present embodiment is included in the focused ion beam apparatus described above.

(1-1) Operating Principles of Condenser Lens (Electrostatic Lens) 2

Figure 2:
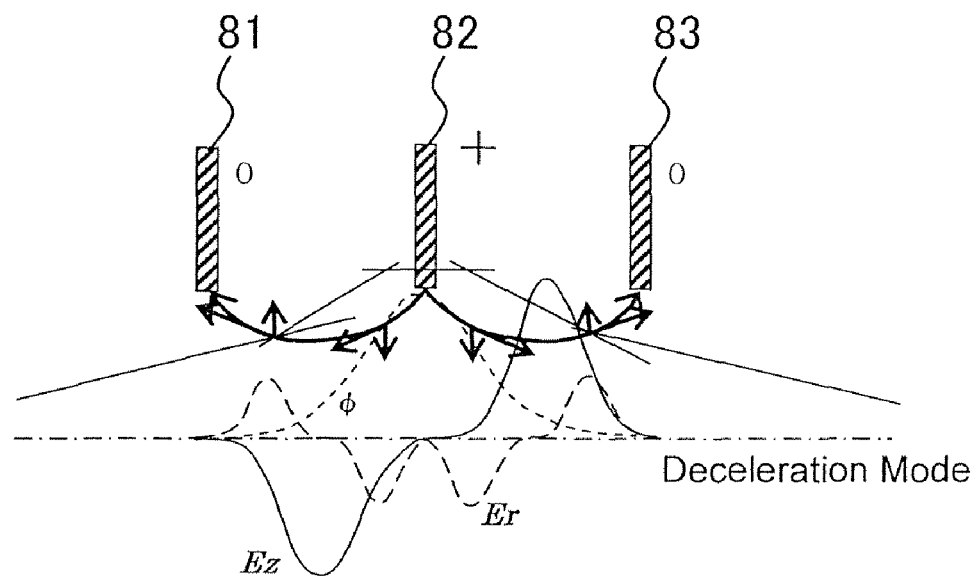
FIGS. 2(a) and 2(b) are diagrams showing a focusing effect in a deceleration mode of a unipotential lens and a focusing effect in an acceleration mode of the unipotential lens.
Figure 2:
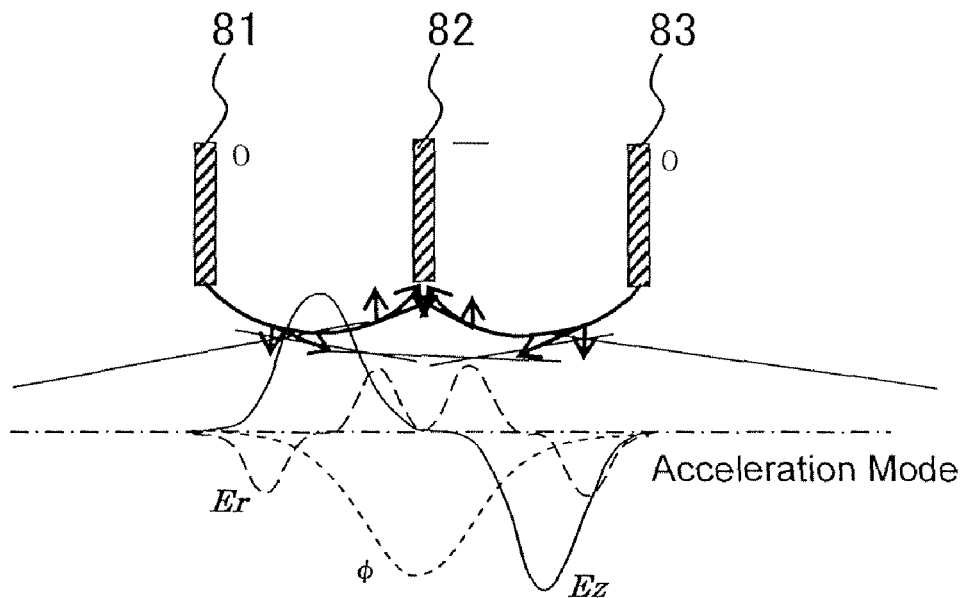

FIGS. 2(a) and 2(b) are simplified diagrams showing the configuration of the condenser lens 2. FIG. 2(b) shows an acceleration mode, while FIG. 2(a) shows a deceleration mode. In FIGS. 2(a) and 2(b), the direction of the optical axis of the ion beam 9 that propagates in the focused ion beam apparatus is a lateral direction of FIGS. 2(a) and 2(b). The condenser lens 2 includes multiple (for example, three) disk-like electrodes that each have a transmission part at a central portion of the electrode through which the ion beam 9 passes. In FIGS. 2(a) and 2(b), a planar cross section of the condenser lens 2, which extends through the optical axis of the condenser lens 2, is illustrated and viewed from one side with respect to the optical axis.

Referring to FIGS. 2(a) and 2(b), the condenser lens 2 has the three electrodes: an incident side electrode 81; an outgoing side electrode 83; and an intermediate electrode 82. The incident side electrode 81 is arranged on the side on which the ion beam 9 emitted by the charged particle gun 30 is incident. The outgoing side electrode 83 is arranged on the side on which the ion beam 9 is output. The intermediate electrode 82 is arranged between the incident side electrode 81 and the outgoing side electrode 83.

A voltage (φ) is applied to the intermediate electrode 82. Then, the incident side electrode 81 and the outgoing side electrode 83 are grounded (at earth potential). As described above, an electrostatic lens, in which a potential of an electrode on which a charged particle beam is incident and a potential of an electrode from which the charged particle beam is output are not changed, is called a unipotential lens. In addition, a mode in which a positive voltage is applied to the intermediate electrode 82 is called a deceleration mode (refer to FIG. 2(a)), while a mode in which a negative voltage is applied to the intermediate electrode 82 is called an acceleration mode (refer to FIG. 2(b)).

The following describes the focusing effect of the condenser lens (electrostatic lens) 2 on the ion beam 9.

Since ions that form the ion beam 9 are charged particles, the charged particles interact with an electric field E and a magnetic field B that are generated in a space through which the charged particles pass.

For example, when a charged particle with an electric charge q and a mass m0 moves at a velocity v in the electric field E and the magnetic field B, a force F acting on the charged particle is expressed by the following Equation 1.

$$\vec{F} = q \cdot (\vec{E} + \vec{v} \times \vec{B})$$ (Equation 1)

The force to which the charged particle is subjected by the electric field E and the magnetic field B is called a Lorentz force.

In the condenser lens 2, only the electric field E that is generated in the three electrodes 81 to 83 acts on the charged particles that form the ion beam 9. The electric field E is (rotationally) symmetric with respect to the optical axis of the condenser lens 2.

When the optical axis of the lens is plotted on a z coordinate (z axis) and a radial direction is plotted on an r coordinate, the electric field E is expressed by using a component Er in the radial direction and a component Ez in the direction of the z coordinate. The components Er and Ez are expressed by the following Equations 2 and 3, respectively.

$$E_r = -\frac{1}{2} \cdot \frac{\partial E_z}{\partial z} \cdot r \quad \text{(Equation 2)}$$

$$E_z = -\frac{\partial \phi}{\partial z} \quad \text{(Equation 3)}$$

The lens effect of the condenser lens 2 is expressed as an integration of curvature in the radial direction (r direction) that is subjected to a force when the charged particle propagates in the electric field E generated by the condenser lens 2. A force Fr to which the charged particle is subjected by the component Er in the radial direction (r direction) of the electric field E is expressed by the following Equation 4.

$$F_r = q \cdot E_r \quad \text{(Equation 4)}$$

The force Fr that is applied in the radial direction can be expressed by the following Equation 5.

$$F_r = m_0 \cdot \frac{dv_r}{dt} \quad \text{(Equation 5)}$$

When Equations 2 and 5 are substituted into Equation 4, Equation 4 is calculated as shown by the following Equation 6, and then the following Equation 7 is obtained.

$$m_0 \cdot dv_r = -\frac{q}{2} \cdot \frac{\partial E_z}{\partial z} \cdot r \cdot dt = -\frac{q}{2} \cdot \frac{\partial E_z}{\partial z} \cdot r \cdot \frac{dz}{dz} \cdot dt \quad \text{(Equation 6)}$$

$$dv_r = -\frac{q}{2 \cdot m_0} \cdot \frac{\partial E_z}{\partial z} \cdot \frac{r}{v_z} \cdot dz \quad \text{(Equation 7)}$$

The aforementioned Equation 7 indicates a change dvr in the velocity of the charged particle in the radial direction (r direction) which is caused by the electric field Er. That is, the direction of propagation of the ion beam 9 that is formed by the charged particles is changed on the basis of the change dvr in the velocity.

The denominator of the right-hand side of Equation 7 includes a component vz of the velocity of the charged particle in the z axis direction. The lower the velocity in the z axis direction, the larger a change in the direction of the propagation of the ion beam 9 (charged particle). In other words, as the velocity vz is lower, the value dvr is increased and a focusing effect acting on the side of the optical axis (z axis) of the lens is increased. In addition, as the velocity vz is increased, the value dvr is reduced and the focusing effect acting on the side of the optical axis of the lens is reduced.

In addition, a value dvr/dz indicates refraction of the ion beam 9. Since the inclination of the beam with respect to the z axis direction is proportional to the r coordinate, the value dvr/dz is related to the focal point of the lens.

In the deceleration mode shown in FIG. 2(a), the ion beam 9 is subjected to a force directed toward the side opposite to the optical axis of the lens at regions near the incident side electrode 81 (grounded) and the outgoing side electrode 83 (grounded) due to the distribution profile of the electric field. However, the ion beam 9 is subjected to a force (focusing force) directed toward the optical axis of the lens at a region near the intermediate electrode 82 (to which the positive voltage is applied). In addition, the charged particles (positive charges) are decelerated at the highest rate at the region near the intermediate electrode 82 included in the condenser lens 2 so that the velocity of the charged particles is reduced. Thus, the condenser lens 2 acts as a convex lens in the deceleration mode.

In the acceleration mode shown in FIG. 2(b), on the other hand, the ion beam 9 is subjected to a force (focusing force) directed toward the optical axis of the lens at regions near the incident side electrode 81 (grounded) and the outgoing side electrode 83 (grounded). However, the ion beam 9 is subjected to a force directed toward the side opposite to the optical axis of the lens at a region near the intermediate electrode 82 (to which the negative voltage is applied). The charged particles (positive charges) are accelerated at the highest rate at a region near the intermediate electrode 82 included in the condenser lens 2 so that the velocity of the charged particles is increased. Thus, the condenser lens 2 also acts as a convex lens in the acceleration mode.

As described above, the condenser lens (electrostatic lens) 2 acts as the convex lens in the deceleration mode (refer to FIG. 2(a)) and the acceleration mode (refer to FIG. 2(b)).

(1-2) Operational Principles of Charged Particle Gun

An ion gun that includes a charged particle source (ion source), an extracting electrode 13, and the earth electrode 15 is described as a comparative example in order to compare with the charged particle gun (ion gun described later) according to the present embodiment. Operational principles of the ion gun according to the comparative example are described.

Figure 3:
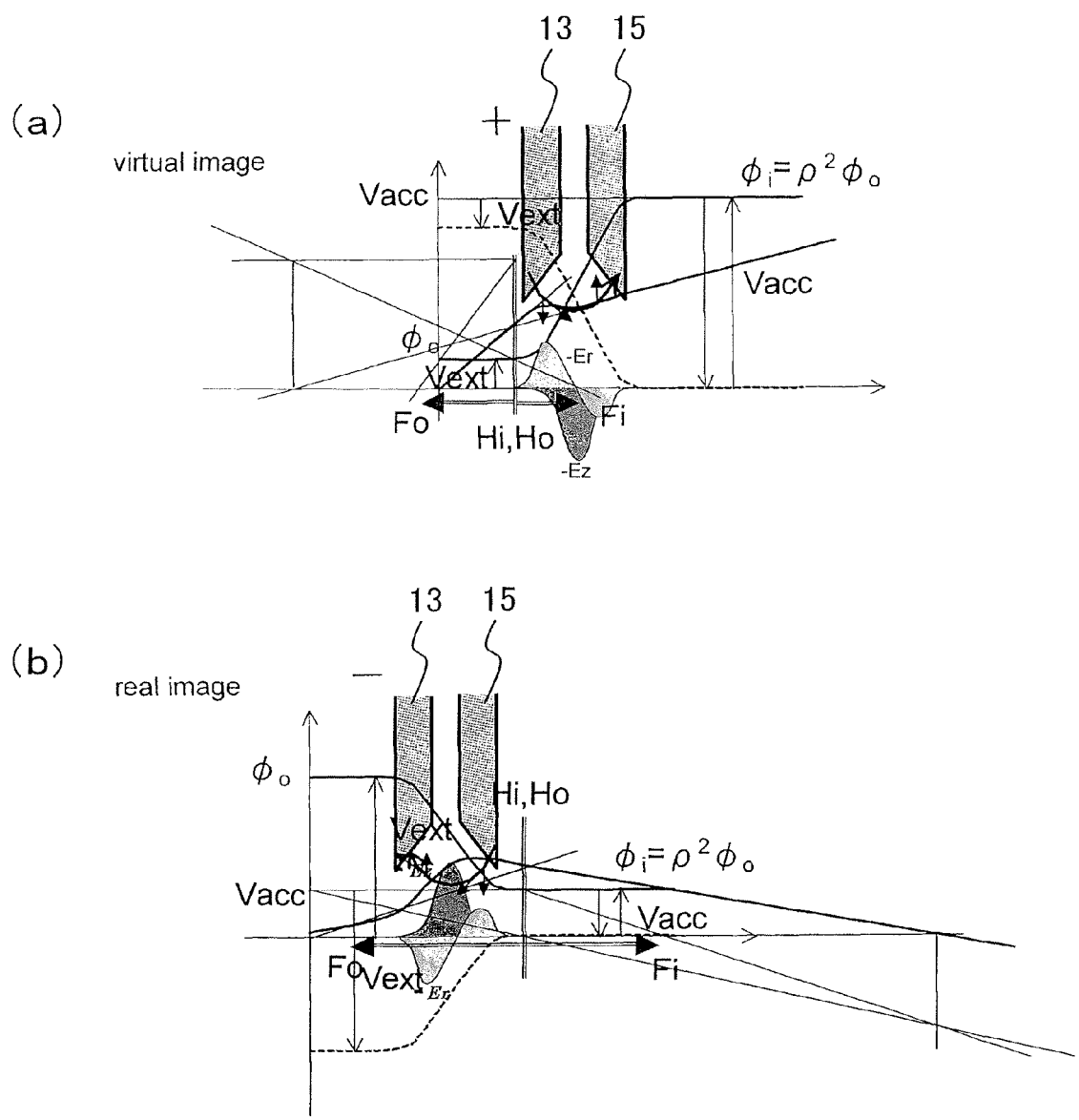
FIGS. 3(a) and 3(b) are diagrams showing a focusing effect on an ion beam in an ion gun.

FIGS. 3(a) and 3(b) show a lens effect of the ion gun as an example. FIG. 3(a) shows the case in which a positive voltage is applied to the extracting electrode 13, while FIG. 3(b) shows the case in which a negative voltage is applied to the extracting electrode 13.

The ion gun shown in FIGS. 3(a) and 3(b) has a lens that is constituted by the ion source, the extracting electrode 13 and the earth electrode 15 (and produces the lens effect). A lens, which includes an incident-side electrode on which a charged particle beam is incident and an outgoing side electrode from which the charged particle beam is output, and in which the two electrodes are different in potential from each other, is called as a bipotential lens. On the other hand, a lens, in which the potential of an incident side electrode on which a charged particle beam is incident and the potential of an outgoing side electrode from which the charged particle beam is output are not changed, is called a unipotential lens.

In FIGS. 3(a) and 3(b), the direction of the optical axis of the lens is a lateral direction. The ion source that is arranged on the optical axis of the lens is treated as an original point, while a distance from the ion source, which is measured in the direction of the optical axis of the lens, is plotted on a z axis. A vertical axis indicates a potential at each point on the optical axis (z axis) of the lens using the ion source as a reference and indicates a distance (distance r in the radial direction) from the optical axis of the lens.

In the ion gun shown in FIGS. 3(a) and 3(b), the ion source emits an ion (charged particle) having a charge q. The ion obtains kinetic energy q·Ve of an extraction potential (potential Ve of the extracting electrode 13, which is measured using the ion source as the reference) immediately after the emission of the ion. After that, the ion moves at a constant speed in an equipotential space and passes through the extracting electrode 13. Then, the ion is accelerated by a difference between the potential Ve of the extracting electrode 13 and the potential of the earth electrode 15 (potential Va of the earth electrode, which is measured using the ion source as the reference). Finally, the ion beam (charged particle beam) having kinetic energy of q·Va is output.

A force that acts on the ion (charged particle) emitted by the ion source is expressed in a similar manner to the case of the electrostatic lens (condenser lens 2). Specifically, when the ion with a charge q and a mass m0 that is emitted by the ion source moves at a velocity v in the electric field E generated by the ion source, the extracting electrode 13, and the earth electrode 15, the component Er of the electric field E in the radial direction and the change dvr in the velocity of the ion in the radial direction (r direction) are expressed by the aforementioned Equations 2 and 7. In the ion gun, the direction of the propagation of the ion beam (charged particle beam) is also changed on the basis of the change dvr in the velocity as shown in Equation 7.

As shown in FIG. 3(a), when a positive voltage is applied to the extracting electrode 13, the ion beam (positive charge) is subjected to a force directed toward the side opposite to the optical axis of the lens at a region near the earth electrode 15 (grounded) due to the distribution profile of the electric field. However, the ion beam (positive charge) is subjected to a force (focusing force) directed toward the optical axis of the lens at a region near the extracting electrode 13 (to which the positive voltage is applied). The ion beam is decelerated at the highest rate at the region near the extracting electrode 13 so that the velocity of the ion beam is reduced. Thus, when the positive voltage is applied to the extracting electrode 13, the ion gun exhibits a convex lens effect. In FIG. 3(a), the ion beam does not form a real image and forms a virtual image due to the lens effect of the ion gun.

On the other hand, as shown in FIG. 3(b), when a negative voltage is applied to the extracting electrode 13, the ion beam (positive charge) is subjected to a force (focusing force) directed toward the optical axis of the lens at a region near the earth electrode 15 (grounded). However, the ion beam (positive charge) is subjected to a force directed toward the side opposite to the optical axis of the lens at a region near the extracting electrode 13 (to which the negative voltage is applied). In addition, the ion beam is accelerated at the highest rate at the region near the extracting electrode 13 so that the velocity of the ion beam is increased. Thus, the ion gun exhibits a convex lens effect even when the negative voltage is applied to the extracting electrode 13. In FIG. 3(b), the ion beam forms a real image due to the lens effect of the ion gun.

Such a lens effect of the bipotential lens included in the ion gun can be described using a value $\rho^2=(Va/Ve)$ as a parameter. When Va=Ve (or $\rho$=1), the lens effect of the ion gun is eliminated. When (0<) $\rho$<1, the focusing effect is increased as $\rho$ is smaller (or farther from 1) and the focal length is smaller. When 1<$\rho$, the focusing effect is increased as $\rho$ is larger (or farther from 1) and the focal length is smaller A point at which the position of the ion source and the focal point overlap each other is called a divergence point. One divergence point is present in each of ranges of 0<$\rho$<1 and 1<$\rho$.

When the focal point of the lens included in the ion gun is present between the ion source 1 and the extracting electrode 13, the ion beam forms an image due to the lens effect of the ion gun. Thus, the ion beam causes a crossover.

When a voltage (threshold voltage) applied to cause the ion source to start emitting ions is indicated by Vco and an acceleration voltage Va is lower than the threshold voltage Vco, a velocity component vz (hereinafter referred to as a velocity vz) of the ion beam in the z axis direction (direction of the optical axis of the lens) is reduced at a region near the earth electrode 15. The smaller the value $\rho^2=(Va/Ve)$ (the lower the acceleration voltage Va), the larger a gradient of a component Ez of the electric field (hereinafter referred to as an electric field Ez) in the z axis direction and the larger a change (reduction) in the velocity vz. When the refraction amount of the ion beam is indicated by dvr/dz, the refraction amount dvr/dz is proportional to an off-axis r (distance from the z axis in the radial direction) from the z axis and the gradient of the electric field Ez is divided by the velocity vz. Thus, the ion beam is strongly focused at a region near the earth electrode 15 (the refraction amount is increased).

On the other hand, when the acceleration voltage Va is higher than the threshold voltage Vco, the velocity vz is increased at a space that is located between the extracting electrode 13 and the earth electrode 15 and in which the ion beam propagates. The larger the value $\rho^2=(Va/Ve)$ (the higher the acceleration voltage Va), the larger the gradient of the electric field Ez and the larger the change (increase) in the velocity vz. In addition, the refraction amount dvr/dz of the ion beam is proportional to the off-axis r and the gradient of the electric field Ez is divided by the velocity vz. Thus, the ion beam is strongly focused at a region near the extracting electrode 13 (the refraction amount is increased).

Next, the relationship between the position of a virtual ion source in the ion gun and Ve/Va (=1/$\rho^2$) is described.

Figure 4:
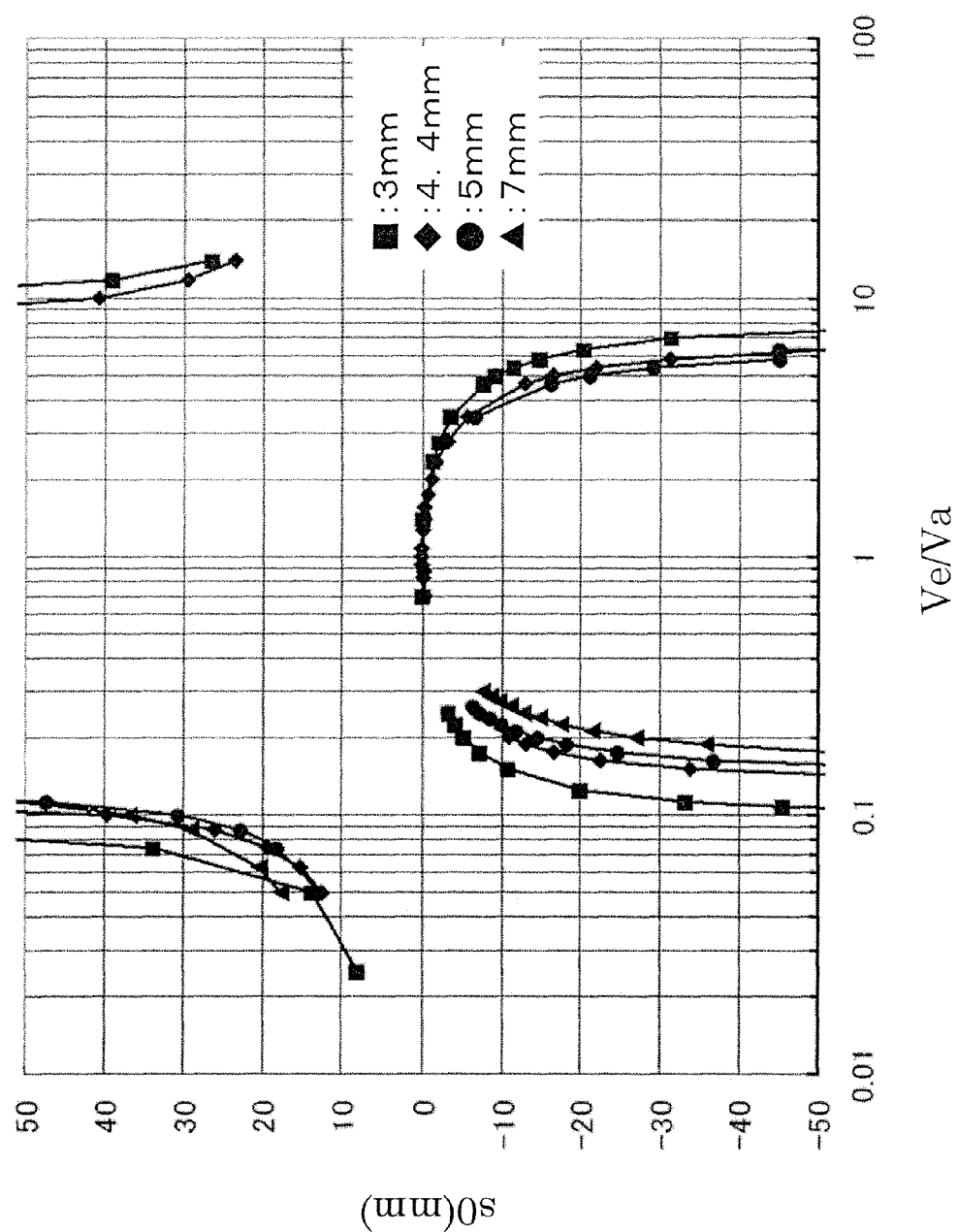
FIG. 4 is a diagram showing the relationship between Ve/Va and the position of a virtual ion source of the ion gun.

FIG. 4 is a diagram showing the relationship between Ve/Va and the position s0 of the virtual ion source relative to the ion source. The abscissa indicates Ve/Va, while the ordinate indicates the position s0. FIG. 4 shows the respective relationships between the value Ve/Va and the position s0 when distances between the ion source and the extracting electrode 13 are 7 mm, 5 mm, 4.4 mm, 4 mm, and 3 mm.

When the ion source is a needle type liquid metal ion source (LMIS), the gradient of an Ie–Ve characteristic that indicates the amount $\Delta$Ve of a change in the voltage Ve (extraction voltage) which is necessary to increase the amount (emission current) Ie of ions emitted by the ion source by 1 $\mu$A is $\Delta$Ve/$\Delta$Ie$\cong$10 (V/$\mu$A). Thus, the extraction voltage Ve may be set to a value nearly equal to Vco (threshold voltage). For example, the threshold voltage Vco of a needle type gallium (Ga) LMIS that is used in a focused ion beam apparatus is in a range of 5 kV to 10 kV. When Vco$\cong$7 kV in consideration of stability of the emission current Ie and the acceleration voltage Va is changed from 40 kV to 1 kV, 1/$\rho^2$=Ve/Va is in a range of 0.1 to 8.

(2) Operational Principles of Focused Ion Beam Apparatus

Next, operational principles of an entire focused ion beam apparatus that includes the ion gun according to the comparative example as a charged particle gun are described.

(2-1) Beam Current Ib

Figure 5:
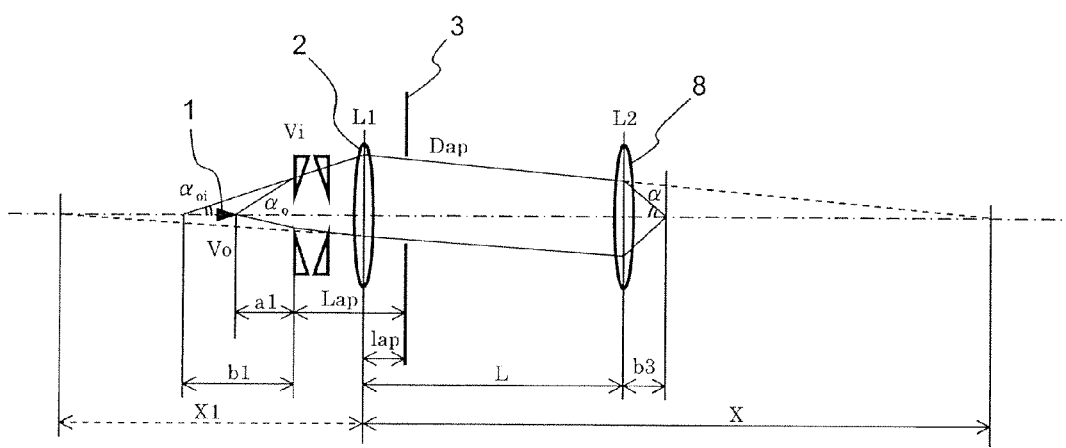
FIG. 5 is a diagram showing positional relationships among members that are included in the focused ion beam apparatus.

FIG. 5 is a diagram showing positional relationships among constituent elements of the focused ion beam apparatus.

A beam current Ib of the ion beam 9 with which the sample 10 is irradiated is expressed by the following Equation 8 using a radiation angle current density J$\omega$, an opening angle $\alpha_{oi}$ of an image surface, the image magnification m1 of the ion gun, the magnification m2 of the condenser lens 2, the magnification m3 of an objective lens, the image magnification M of an entire optical system, the extraction voltage (object point voltage) Ve, and the acceleration voltage Va.

$$I_b = J\omega \cdot \pi \cdot \alpha_0^2 = J\omega \cdot \pi \cdot \left(\alpha_{oi} \cdot m_1 \cdot \left(\frac{V_i}{V_o}\right)^{\frac{1}{2}}\right)^2$$
$$= J\omega \cdot \pi \cdot \left(\alpha_{oi} \cdot m_1 \cdot \left(\frac{V_a}{V_e}\right)^{\frac{1}{2}}\right)^2$$

(Equation 8)

The opening angle $\alpha_{oi}$ of the image surface, the image magnification m1 of the ion gun, the magnification m2 of the condenser lens 2, the magnification m3 of the objective lens, the image magnification M (hereinafter merely referred to as the magnification M) of the entire optical system which are used in the aforementioned equation 8 are expressed by the following Equations 9 to 13, respectively.

$$\alpha_{oi} = \tan^{-1}\left(\frac{D_{ap}}{2\cdot(X \pm l_{ap})}\right)\cdot m_2 \quad \text{(Equation 9)}$$

$$m_1 = \frac{b_1}{a_1}\cdot\left(\frac{V_o}{V_i}\right)^{\frac{1}{2}} = \frac{1}{m_\varepsilon}\cdot\left(\frac{V_e}{V_a}\right)^{\frac{1}{2}} \quad \text{(Equation 10)}$$

$$m_2 = \frac{X}{b_1 + (L_{ap} - l_{ap})} \quad \text{(Equation 11)}$$

$$m_3 = \frac{b_3}{X \pm L} \quad \text{(Equation 12)}$$

$$M = m_1 \cdot m_2 \cdot m_3 \quad \text{(Equation 13)}$$

For the operator ± that is used in the aforementioned Equations 9 and 12, when the operator is minus (−), the operator indicates a real image formed by the condenser lens; and when the operator is plus (+), the operator indicates a virtual image formed by the condenser lens. In addition, symbols a1, b1, Lap, lap, L, b3, and X each indicate a distance between parts of the focused ion beam apparatus as shown in FIG. 5.

When the opening angle $\alpha_{oi}$ of the image surface, which is calculated using Equation 9, is substituted into Equation 8, the following Equation 14 can be obtained to calculate the beam current Ib.

$$I_b = J\omega \cdot \pi \cdot m_1^2 \cdot m_2^2 \cdot \frac{V_a}{V_e}\cdot\tan^{-2}\left(\frac{D_{ap}}{2\cdot(X \pm l_{ap})}\right) \quad \text{(Equation 14)}$$

(2-2) Diameter d of Beam

The diameter d of the ion beam 9 with which the sample 10 is irradiated is expressed by the following Equation 15 using the magnification M of the entire optical system, a chromatic aberration coefficient Cc, a spherical aberration coefficient Cs, the opening angle α of the beam on the side of an image surface of the objective lens.

$$d = \left((M\cdot d_0)^2 + \left(\frac{1}{2}\cdot C_s\cdot\alpha^3\right)^2 + \left(C_c\cdot\frac{\Delta V}{V_a}\cdot\alpha\right)^2\right)^{\frac{1}{2}} \quad \text{(Equation 15)}$$

In addition, the opening angle α on the side of the image surface of the objective lens, which is used in the aforementioned Equation 15, is expressed by the following Equation 16 using the beam current Ib and the magnification M of the optical system.

$$\alpha = \left(\frac{I_b}{J\omega}\cdot\frac{1}{\pi\cdot M^2}\left(\frac{V_e}{V_a}\right)\right)^{\frac{1}{2}} \quad \text{(Equation 16)}$$

When the aforementioned Equation 16 that calculates the opening angle α on the side of the image surface of the objective lens is substituted into the aforementioned Equation 15 that calculates the diameter d of the ion beam 9, the diameter d of the ion beam can be calculated.

(2-3) Current Density J

A current density J of the ion beam 9 with which the sample 10 is irradiated is expressed by the following Equation 17 using the beam current Ib and the diameter d of the beam.

$$J = \frac{I_b}{\pi\cdot\left(\frac{d}{2}\right)^2} \quad \text{(Equation 17)}$$

(2-4) Consideration of Large Current Column

In order to use a large current in the focused ion beam apparatus (large current column), the beam current Ib is considered below.

It is apparent from the aforementioned Equation 14 (related to the beam current Ib) that when the image magnification m1 of the ion gun, the magnification m2 of the condenser lens 2 or the diameter Dap of the objective aperture 3 is increased, the beam current Ib is increased. A change rate of the magnification m2 is larger than the other parameters. Thus, the magnification m2 is effective to increase the beam current Ib.

As is apparent from the aforementioned Equation 11, the larger the distance X, the larger the magnification m2 of the condenser lens. In addition, the smaller the distance Lap or a value (Lap−lap), the larger the magnification m2 of the condenser lens. In consideration of the features, the focused ion beam apparatus (large current column) is configured.

As is apparent from the aforementioned Equation 13, when the magnification m2 of the condenser lens is increased, the magnification M of the optical system is also increased. When the current (beam current Ib) is large, the second term of the aforementioned Equation 15 is more affected than the first term of Equation 15. Thus, when there is a solution that causes the opening angle α of the beam on the side of the image surface of the objective lens 8 calculated using the aforementioned Equation 16 to be equal or smaller, a beam having a high current density J can be obtained. Specifically, the spherical aberration of the objective lens 8 can be reduced when the following conditions are satisfied: the focal length of the condenser lens 2 is short; the ion beam 9 is a parallel beam or slightly focused toward the optical axis without propagating away from the optical axis; and the beam current Ib is increased without increasing the diameter Dap of the objective aperture.

In the focused ion beam apparatus, the beam current Ib can be changed by the objective (adjustable) aperture 3 and is selected on the basis of the volume of a sample portion to be processed and the accuracy of the processing, and the sample is processed with high accuracy at a high speed by performing beam scanning that is suitable to process the sample.

However, when the magnification M causes the diameter d of the beam to be minimized, the magnification M varies depending on the beam current Ib. Thus, the magnification M is controlled on the basis of the beam current Ib (aperture diameter) in such a manner that the current density is maximized. Actually, the chromatic aberration coefficient Cc and the spherical aberration coefficient Cs can be calculated as functions of the magnification M. Thus, the diameter d of the beam that has the beam current Ib is expressed as a function of the magnification M, and the magnification M (AP) is calculated from this function so that the magnification M is optimized and the diameter d of the beam is minimized. In this case, the calculated magnification M (AP) causes the diameter d of the beam to be the minimum diameter dmin (or causes the current density to be the maximum current density) while a necessary beam current Ib is obtained due to the aperture diameter.

Specifically, a table is prepared to store a voltage that is applied to the intermediate electrode 82 included in the condenser lens 2 on the basis of the aperture diameter so that the magnification M(AP) that causes the current density to be the maximum current density (or causes the beam diameter to be the minimum beam diameter dmin) is set. When the aperture diameter is changed, the voltage is applied to the intermediate electrode 82 included in the condenser lens 2 in accordance with the table so that the maximum current density (minimum beam diameter dmin) is obtained.

As shown in FIG. 1, the ion beam 9 emitted by the ion source (LMIS) 1 is restricted by the beam restricting (GUN) aperture 14 of the extracting electrode 13 in the focused ion beam apparatus. After that, the ion beam 9 passes through the beam scanner (deflector) 7 and the objective lens 8. Then, the sample 10 that is placed on a sample stage 11 and grounded is irradiated with the ion beam 9.

In the focused ion beam apparatus that uses the gallium (Ga) liquid metal ion source (LMIS) as the ion source 1, and the objective lens 8 (electrostatic lens) whose working distance is 6 mm and in which the extraction voltage is 7 kV or higher and the acceleration voltage Va is equal to 30 kV, it is necessary that the distance between the ion source 1 and the extracting electrode 13 be 5 mm and the distance between the ion source 1 and a main surface of the condenser lens 2 be 21 mm or less in order to obtain a ion beam 9 that has a diameter d of 1 μm and a beam current Ib of approximately 40 nA. When the extracting electrode 13, the earth electrode 15, and a condenser electrode 17 are placed in a range of 16 mm, it is necessary that a distance between the electrodes 13 and 15 and a distance between the electrodes 15 and 17 be 8 mm or less.

In addition, when a withstand voltage in vacuum is 10 kV/mm and the apparatus is designed in consideration of the withstand voltage of 30 kV, it is necessary that the thickness of each of the electrodes be 1 mm and a distance be set to 5 mm (1 mm+3 mm+1 mm) or larger. However, when the distances between the electrodes are set to 5 mm, and the acceleration voltage Va and the extraction voltage Ve are equal to 30 kV and 7 kV, respectively, and the magnification of the ion gun is increased. Thus, the resolution is reduced. In this case, when the beam current Ib is equal to 40 nA, the diameter d of the ion beam 9 cannot be reduced to approximately 1 μm. Thus, it is necessary that the distances between the electrodes be set to 6 mm or more when the diameter d of the ion beam 9 is approximately 1 μm and the beam current Ib is approximately 40 nA. Furthermore, in order to support the case when the acceleration voltage Va is 40 kV or less, it is necessary that the distances between the electrodes be set to 6 mm or more. When the magnification of the ion gun is less affected, the maximum beam current of the apparatus is roughly proportional to the acceleration voltage Va.

Figure 6:
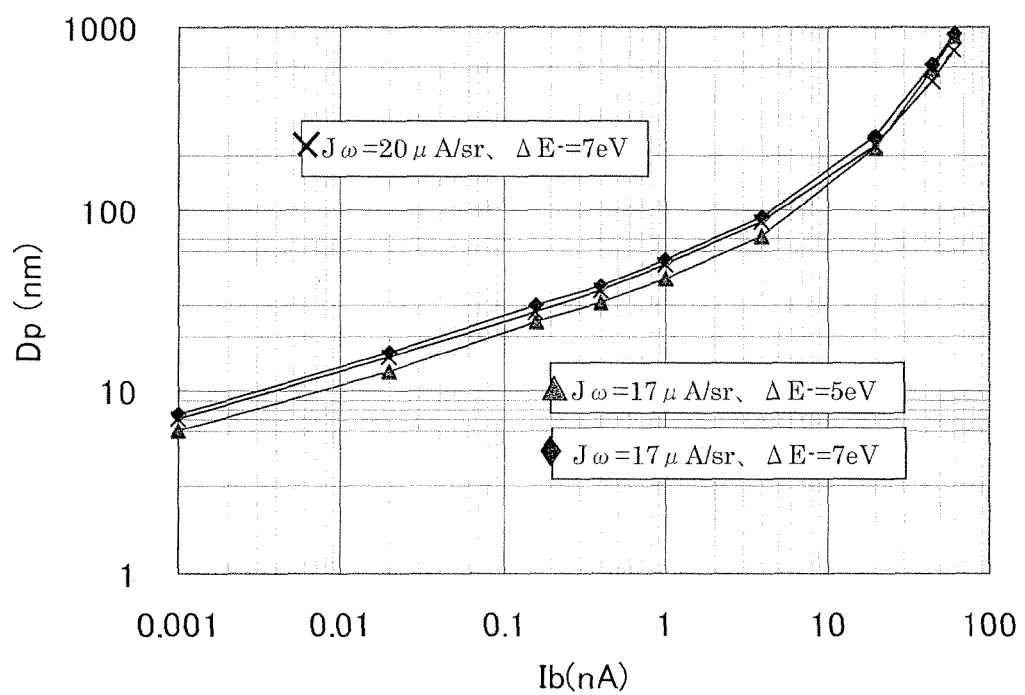
FIG. 6 is a diagram showing the relationship between a beam current and the diameter of a beam.

FIG. 6 is a diagram showing the relationship between the beam current Ib and the beam diameter Dp in the focused ion beam apparatus that includes the ion gun in which the acceleration voltage Va is 40 kv, the distance between the ion source (GaLMIS) 1 and the extracting electrode 13 is 5 mm, and the distance between the extracting electrode 13 and the earth electrode 15 is 8 mm. The beam diameter Dp is the minimum value obtained by controlling the magnification in the focused ion beam apparatus under each of conditions.

As characteristic values of the gallium (Ga) LMIS, the size d0 of the ion source is set to 50 nm; the radiation angle current density Jω is set to 17 μA/sr; and the energy width Ie of the radiation beam is set to 2 μA and ΔE is set to 5 eV, and Ie is set to 3.2 μA to and ΔE is 7 eV. Although the radiation angle current density Jω is generally set to approximately 20 μA/sr, the radiation angle current density Jω is set to 17 μA/sr in consideration of the fact that the beam current Ib is reduced due to the relationship between the thickness and opening of the objective aperture 3.

(2-5) Consideration of Low Acceleration

In the focused ion beam apparatus, the sample 10 is irradiated with the charged particles (ion beam 9) accelerated by the acceleration voltage Va applied by the earth electrode 15 so that atoms that constitute a part of the sample 10 are sputtered and the sample is thereby finely processed. When the sample 10 is irradiated with the ion beam 9 of, for example, gallium (Ga) ions having a mass equal to or larger than atoms (e.g., silicon (Si)) that constitute a part of the sample 10, the atoms that constitute a part of the sample 10 are sputtered by energy that is much larger than the binding energy of the atoms. Thus, vacancies and disorder may be formed in atoms that constitute the sample 10. As a result, an amorphous layer may be formed on the sample surface irradiated with the charged particle beam. The sample surface to be processed is observed by an electron scanning microscope or a thin portion of the sample is observed by a transmission electron microscope. In such cases, if the sample surface has been covered with an amorphous layer, then the sample surface cannot be obtained in the form of a clear image, resulting in obstruction to the observation of the sample surface.

The formation of the amorphous layer can be suppressed to some extent, for example, by reducing the acceleration voltage to be applied to the charged particles and thereby reducing the energy of the charged particle beam. However, when the acceleration voltage is reduced and the irradiation with the charged particle beam is performed, astigmatism is increased at the position of the sample. Thus, the beam cannot be focused. Therefore, the processing accuracy may be reduced (or the sample may not be finely processed). In addition, since the beam current is reduced (irradiation energy of the ion beam 9 is reduced) in proportion to the acceleration voltage, the processing speed and the processing efficiency may be reduced.

Consequently, a low acceleration voltage Va in the focused ion beam apparatus is considered below.

When the acceleration voltage is low (or reduced), the speed of the ion beam (ions) 9 is low. Thus, the lens effect of the ion gun is largely affected.

Figure 7:
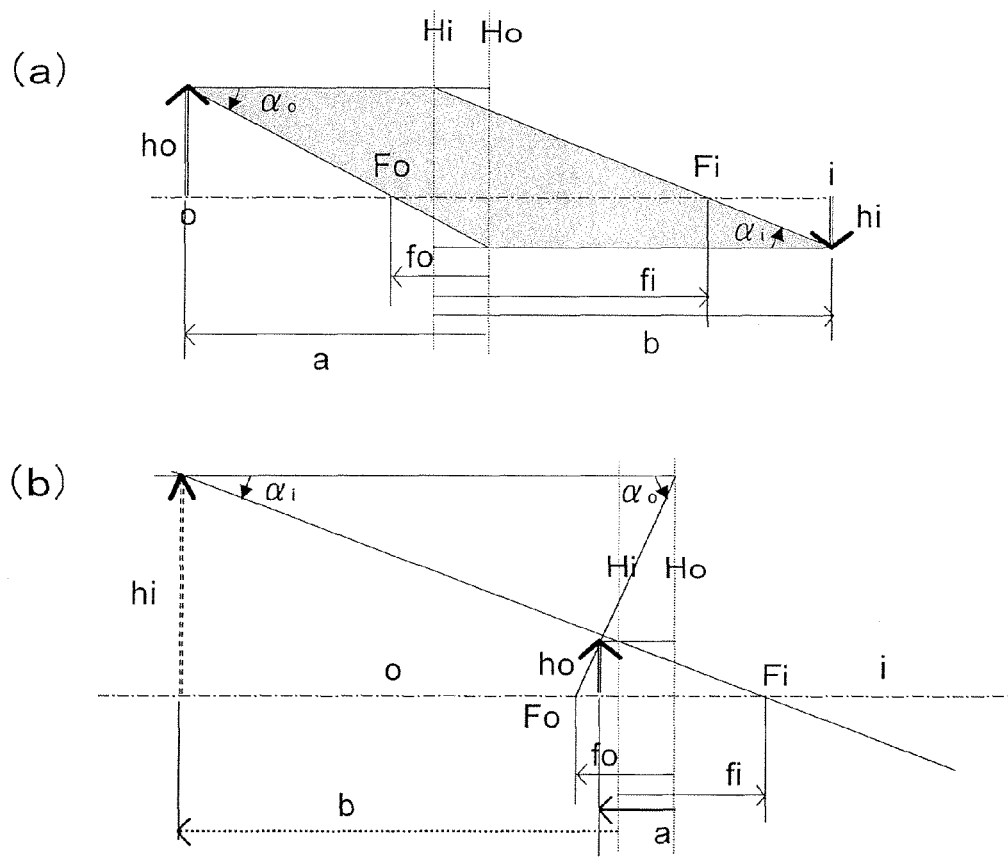
FIGS. 7(a) and 7(b) are diagrams showing an imaging relationship of a bipotential lens.

FIGS. 7(*a*) and 7(*b*) are diagrams showing the lens effect of the ion gun. FIG. 7(*a*) shows real imaging, while FIG. 7(*b*) shows virtual imaging.

The lens (bipotential lens) of the ion gun exhibits a large lens effect at a location at which the speed of the beam is low. Thus, as shown in FIGS. 7(*a*) and 7(*b*), the lens of the ion gun has a large thickness and the following two main surfaces (at which a ion beam is refracted): an object surface Ho on the front side (upstream side of the ion beam 9) of the lens; and an image surface Hi on the back side (downstream side of the ion beam 9) of the lens. In addition, when the acceleration voltage Va is lower than the threshold voltage (emission threshold voltage) Vco, the main surfaces are located in the vicinity of the earth electrode 15. On the other hand, when the acceleration voltage Va is higher than the threshold voltage Vco, the main surfaces are located in the vicinity of the extracting electrode 13. Consequently, the positions of the main surfaces are significantly changed on the basis of the acceleration voltage Va.

FIGS. 8(a) and 8(b) are diagrams showing relationships among the value ρ, the focal point Hi−fo of the ion gun, and an image forming point Hi+b. FIG. 8(a) shows the case where $0 \leq \rho \leq 1$, while FIG. 8(b) shows the case where $1 \leq \rho$.

When the acceleration voltage Va is higher than the threshold voltage Vco, the ion source (LMIS) 1 is placed on an inner side of the focal length Fo of the lens of the ion gun (or on the side of the extracting electrode 13) (refer to FIG. 7(b)). However, when the value ρ is changed, the lens main surfaces (object surface, image surface) Ho, Hi, and focal lengths Fo, Fi are changed.

In order to set the beam current to be large and set the current density to be high in the ion beam 9, it is necessary that the condenser lens 2 be placed near the ion source 1. Thus, the distance between the ion source 1 and the extracting electrode 13 is set to 5 mm and the distance (Lo) between the extracting electrode 13 and the earth electrode is set to 8 mm.

(2-6) Ion Gun According to Comparative Example

The ion gun according to the comparative example is described and operational principles of the ion gun according to the comparative example are described in order to compare with the charged particle gun (ion gun) according to the present embodiment. In addition, the focused ion beam apparatus that includes the ion gun according to the comparative example is described in detail.

Figure 9:
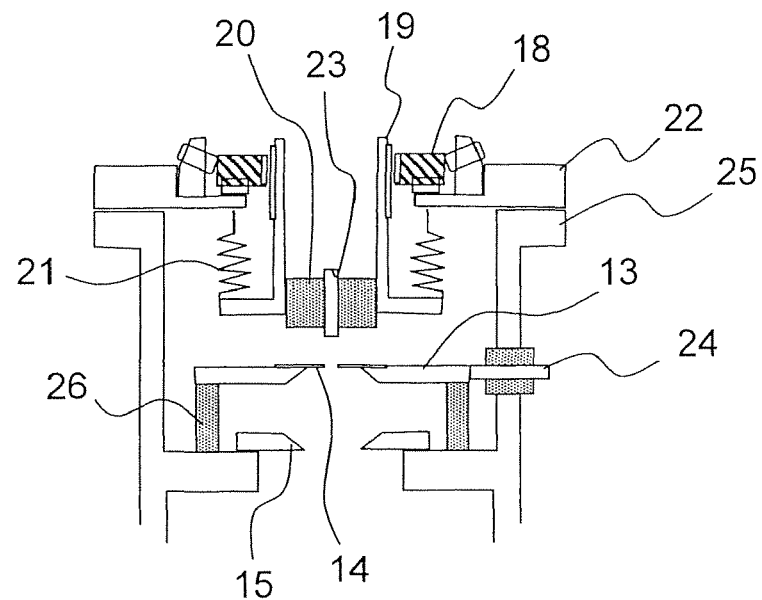
FIG. 9 is a diagram showing a configuration of an ion gun according to a comparative example.
Figure 10:
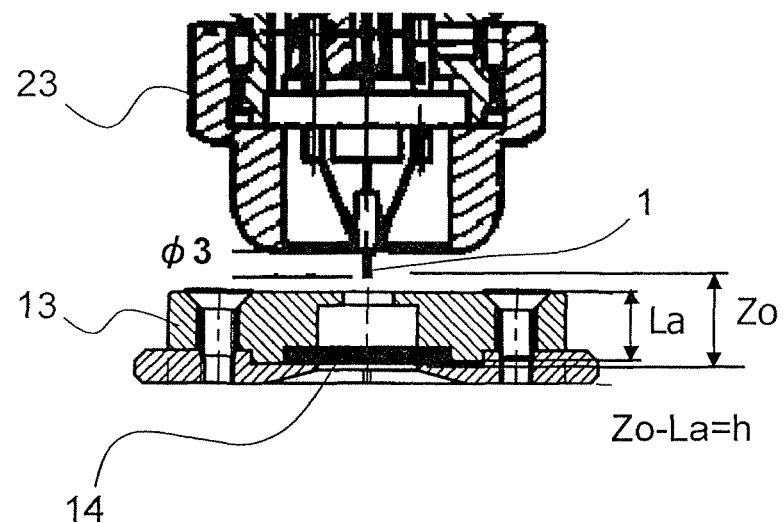
FIG. 10 is a diagram showing a configuration of the ion gun according to the comparative example.

FIG. 9 is a diagram showing the configuration of the ion gun (charged particle gun) according to the comparative example. FIG. 10 is an enlarged view of a periphery of the ion source (LMIS) according to the comparative example.

Referring to FIG. 9, the ion gun according to the comparative example includes the ion source 1 (refer to FIG. 10), the extracting electrode 13, the beam restricting aperture 14, and the earth electrode 15.

The ion source (LMIS) 1 is held by an LMIS holder 23. The LMIS holder 23 is fixed to a cylindrical member 19 through an ion source insulator 20. The cylindrical member 19 has a male screw portion at an outer circumference of the cylindrical member 19. A ring-shaped disk 18 has a female screw portion at an inner circumference of the ring-shaped disk. The female screw portion of the ring-shaped disk 18 and the male screw portion of the cylindrical member 19 are screwed together. The ring-shaped disk 18 is rotatably held by a holding member 22. The holding member 22 is fixed to a holding member 25. The cylindrical member 19 and the holding member 22 are connected to each other through bellows 21. The vertical position (in a vertical direction in FIG. 9) of the LMIS holder 23 (ion source) can be adjusted by rotating the ring-shaped disk 18 relative to the cylindrical member 19. The LMIS holder 23 has a voltage terminal and an energization heating mechanism (that are not shown). The LMIS holder 23 is capable of applying a high voltage to the ion source (LMIS) 1 and performing flashing (energization heating).

The extracting electrode 13 is arranged on the downstream side (lower side in FIG. 9) of the LMIS holder 23 (ion source 1). The extracting electrode 13 is fixed to the holding member 25 through the insulator 26. The beam restricting aperture 14 is arranged on the upstream side (upper side in FIG. 9) of the extracting electrode 13. A voltage can be applied to the extracting electrode 13 through a voltage terminal 24. The earth electrode 15 is arranged on the downstream side of the extracting electrode 13 and fixed to the holding member 25. Relative positions of the extracting electrode 13 and the earth electrode 15 are fixed (or the distance between the extracting electrode 13 and the earth electrode 15 is fixed). The extracting electrode 13 and the earth electrode 15 are arranged in such a manner that the center of a portion of the extracting electrode 13 through which the ion beam passes and the center of a portion of the earth electrode 15 through which the ion beam passes are positioned on the same axis.

In the ion gun configured as described above, the extracting electrode 13 and the earth electrode 15 constitute the lens of the ion gun, and the ion source 1 and the lens of the ion gun are separated from each other (and the distance between the ion source 1 and the lens of the ion gun can be adjusted).

In order to reduce an insulating effect of the extracting electrode 13, a structure in which the extracting electrode 13 is hung from the ion source insulator 20 of the LMIS 1 can be considered. In this structure, however, there is a problem that the concentricity of the extracting electrode 13 and the earth electrode 15 is reduced and the diameter d of the beam cannot be reduced.

When a distance between a surface located on the downstream side of the extracting electrode 13 (lower side in FIG. 10) and a surface located on the upstream side of the extracting electrode 13 (upper side in FIG. 10) is indicated by La, and a distance between the surface located on the downstream side of the extracting electrode 13 and an edge of the LMIS 1 is indicated by Zo, the vertical position (distance between the edge of the LMIS 1 and the extracting electrode 13) h of the ion source 1 is equal to a value of Zo−La. In the ion gun according to the comparative example, when the vertical position h (=Zo−La) of the ion source 1 is changed, the extraction voltage Ve is changed. In addition, it can be considered that the extraction voltage Ve is equal to the threshold voltage Vco of the LMIS 1. Thus, the relationship between the vertical position h of the ion source 1 and the threshold voltage Vco is expressed by the following Equation 18.

$$V_{co} = \ln\left(\frac{2 \cdot h}{r}\right)\left(\frac{\gamma \cdot r}{\varepsilon_0}\right)^{\frac{1}{2}} \qquad \text{(Equation 18)}$$

In Equation 18, γ is surface tension of the gallium liquid metal and r is the size of an emission point.

In Equation 18, when the distance h (=Zo−La) between the extracting electrode 13 and the edge of the LMIS 1 is changed to a distance h+Δh, the threshold voltage Vco is increased by a value of $\ln(1+\Delta h/h) \times (\gamma \cdot r/\varepsilon_0)^{0.5}$ with respect to the original value. Thus, when Δh<0 or the distance between the extracting electrode 13 and the edge of the LMIS 1 is reduced, the threshold voltage Vco is reduced and the value ρ is increased. However, the lens effect of the lens (bipotential lens) of the ion gun is changed by changing the distance h. Thus, in order to consider an increase and reduction in the beam current Ib, the lens effect (characteristics of the bipotential lens) of the ion gun, which is changed by changing both the value ρ and the vertical position h of the ion source 1, needs to be considered.

Figure 8:
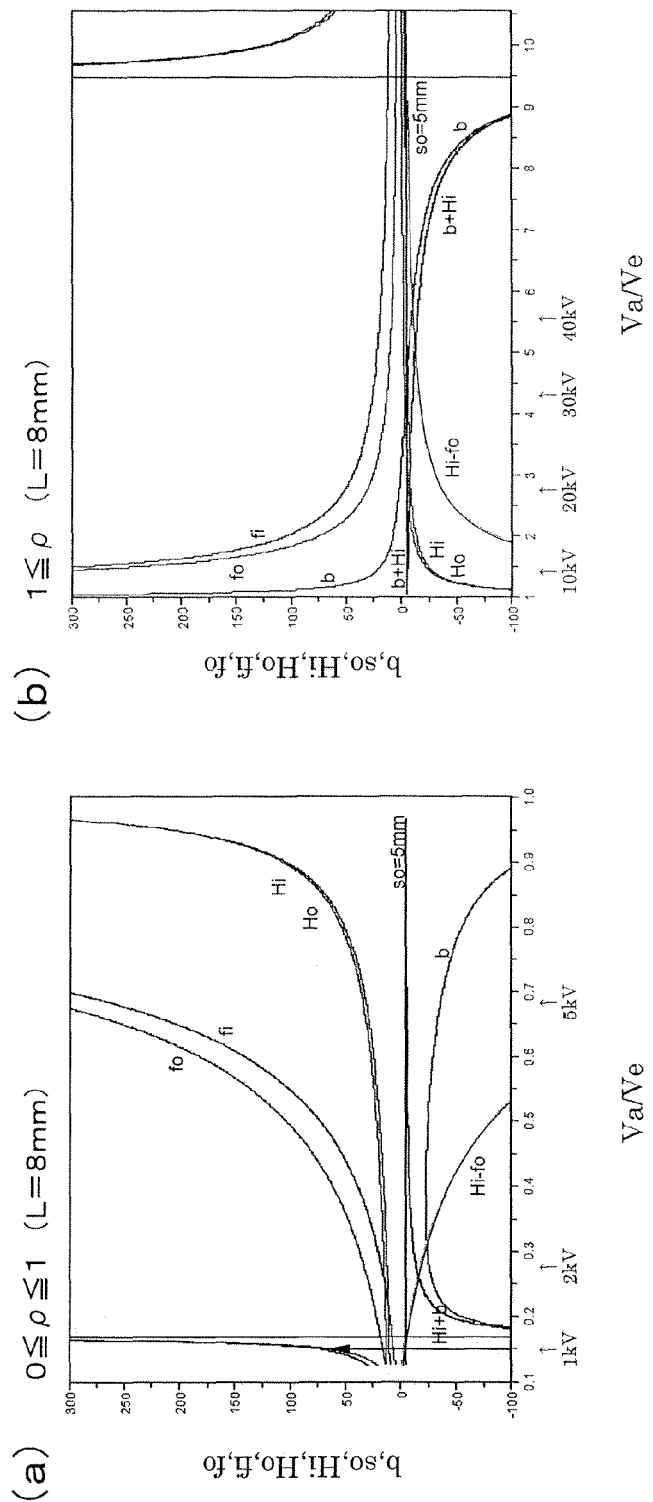
FIGS. 8(a) and 8(b) are diagrams showing the relationship between Va/Ve and an imaging point of the ion gun.

As is apparent from FIG. 8, when Va=Ve (ρ=1), the lens effect is eliminated or the focal point f becomes a point at infinity. When 0<ρ<1, the focusing effect is increased as ρ is reduced (far from 1). When 1<ρ, the focusing effect is increased as ρ is increased (far from 1).

When the position s0 of the LMIS 1, which is measured using the position of the extracting electrode 13 as a reference, overlaps with the focal point Hi−fo, an image forming point Hi+b diverges. The divergence point is present in each of ranges of 0<ρ<1 and ρ>1. When the focal length is reduced, a crossover (imaging of the ion beam, which is caused by the lens effect of the ion gun) occurs.

When the acceleration voltage Va is in a range of 40 kV to 2 kV in the ion gun according to the comparative example, a virtual image that is called a virtual ion source is formed on the upstream side (upper side) of the ion source 1 by the lens effect of the ion gun according to the comparative example. However, when the acceleration voltage is 1 kV, a crossover is formed on the downstream side (lower side) of the ion source 1. Thus, it is apparent that when the acceleration voltage Va is any of values in a range of 2 kV to 1 kV, the divergence occurs. For example, when the acceleration voltage Va is 2 kV in the actual ion gun (refer to FIG. 10), Vco=7 kV, $\rho^2$=0.28. When the acceleration voltage Va is 1 kV, $\rho^2$=0.14 and a crossover is formed by the lens effect of the ion gun. When the acceleration voltage Va is in a range of 1 kV to 2 kV, therefore the divergence point is present and the value $\rho^2 \cong 0.16$.

In the aforementioned ion gun according to the comparative example, as a result of an experiment in which the beam (each parameter of the focused ion beam apparatus) is adjusted with the acceleration voltage of 1 kV, when the extraction voltage Ve=7±0.25 kV, the apparatus cannot be necessarily adjusted without changing the position of the LMIS 1 and the position of the objective aperture 3 in such a manner that the beam to which the acceleration voltage Va of 40 kV to 1 kV is applied passes (reaches the sample 10). For example, when the position of the LMIS 1 and the position of the objective aperture 3 are adjusted in such a manner that the beam to which the acceleration voltage Va of 1 kV is applied can pass, and then the acceleration voltage is changed to 40 kV, the beam does not pass.

Figure 11:
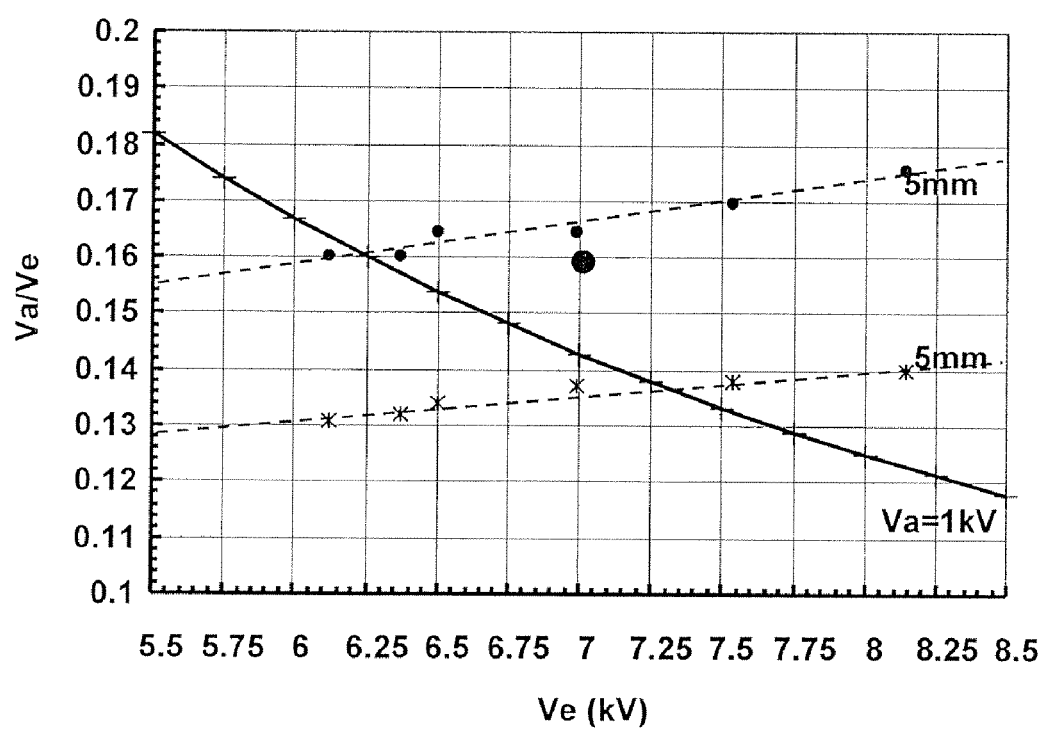
FIG. 11 is a diagram showing the relationship between an extraction voltage and Va/Ve.
Figure 12:
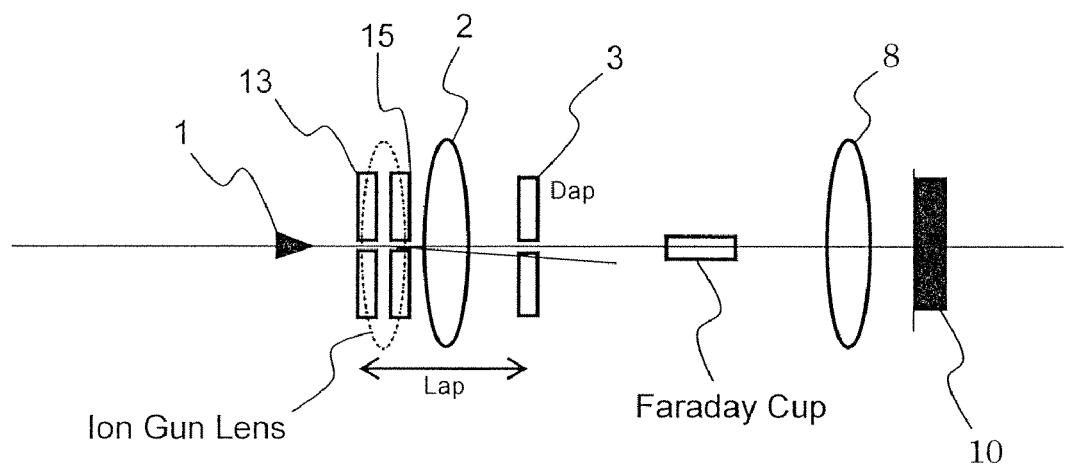
FIG. 12 is a simplified diagram showing the entire configuration of the focused ion beam apparatus.

FIG. 11 is a diagram showing the relationship between the extraction voltage Ve and $\rho^2$ (=Va/Ve), which prevents the beam from passing. FIG. 12 is a schematic diagram showing the constituent elements of the focused ion beam apparatus.

In FIG. 11, the abscissa indicates the extraction voltage Ve, and the ordinate indicates $\rho^2$ (=Va/Ve). One of two dotted lines shown in FIG. 11 indicates the relationship between the extraction voltage Ve and Va/Ve, which prevents the beam from passing when the distance between the extracting electrode 13 and the ion source (LMIS) 1 is 5 mm and the acceleration voltage Va is 2 kV, while the other dotted line shown in FIG. 11 indicates the relationship between the extraction voltage Ve and Va/Ve, which prevents the beam from passing when the distance between the extracting electrode 13 and the ion source (LMIS) 1 is 5 mm and the acceleration voltage Va is 1 kV.

As described above, the lens effect of the ion gun lens varies according to the ratio (Va/Ve=$\rho^2$) of the acceleration voltage Va to the extraction voltage Ve. When Va=Ve ($\rho$=1), the lens effect is eliminated. When 0<$\rho$<1, the focusing effect (lens effect) is increased and the focal length is reduced as $\rho$ is smaller (farther from 1). When 1<$\rho$, the focusing effect (lens effect) is increased and the focal length is reduced as $\rho$ is larger (farther from 1). A point at which the focal point and the ion source overlap each other is called as the divergence point.

In the ion gun according to the comparative example, when the acceleration voltage Va is in the range of 40 kV to 2 kV, the virtual image that is called the virtual ion source is formed on the upstream side (upper side) of the ion source 1 by the lens effect of the ion gun. However, when the acceleration voltage Va is 1 kV, the crossover is formed on the downstream side (lower side) of the ion source 1. Thus, the divergence occurs when the acceleration voltage Va is any of values in the range of 2 kV to 1 kV.

It is apparent that the divergence point is present between the two dotted lines (indicating the relationship between the extraction voltage Ve and Va/Ve when the acceleration voltage Va is 2 kV and the relationship between the extraction voltage Ve and Va/Ve when the acceleration voltage Va is 1 kV) shown in FIG. 11. At a region near the divergence point, the position s0 of the virtual ion source relative to the ion source 1 is changed from the virtual image (apparent formed image) formed on the upstream side (−∞) of the ion source 1 to the real image (image formed on the downstream side of the ion source) formed on the downstream side (+∞) of the ion source 1.

The divergence point (Ve ($\cong$Vco)$\cong$7 kV, $\rho^2 \cong$0.16) in the ion gun according to the comparative example is present between the two dotted lines shown in FIG. 11.

Figure 13:
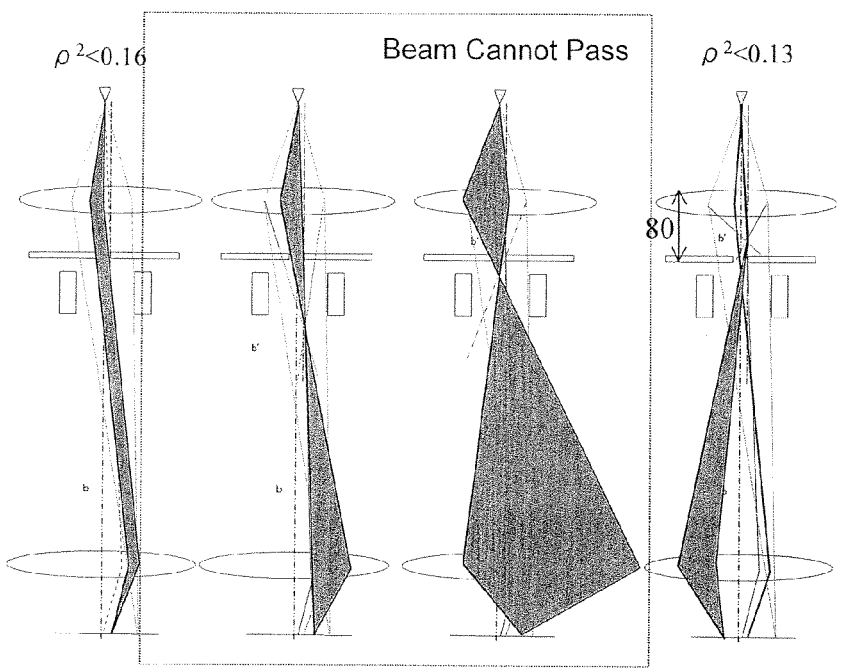
FIGS. 13(a) and 13(b) are diagrams showing the state of an ion beam with respect to ρ^2.
Figure 13:
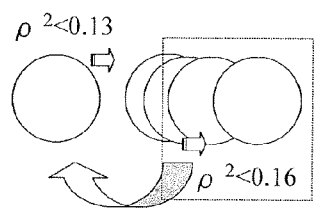

FIG. 12 is a schematic diagram showing the constituent elements of the focused ion beam apparatus. FIGS. 13(*a*) and 13(*b*) are diagrams showing the relationships between the constituent elements and the ion beam 9.

As shown in FIG. 12, in the focused ion beam apparatus, the charged particle (ion beam) emitted from the ion source 1 passes through the ion gun lens, the condenser lens 2, the objective aperture 3, and the objective lens 8 so that the sample 10 is irradiated with the charged particle.

As shown in FIG. 13, when the optical axis of the lens constituted by the extracting electrode 13 and the earth electrode 15 is misaligned from an axis that extends through the ion source (LMIS) 1 and the center of the objective aperture 3, the ion beam 9 does not pass through the objective aperture 3 in the process in which the beam is focused after occurring of the divergence. In this case, the position of the ion beam 9 emitted by the focused ion beam apparatus moves as shown in FIGS. 13(*a*) and 13(*b*).

When all the optical axes of the ion gun lens, the condenser lens 2, and the objective lens 8 match each other, the ion beam 9 passes regardless of the acceleration voltage Va.

However, it is difficult to completely match the optical axes of the lenses, and the optical axes are slightly misaligned. If a certain lens that acts on the ion beam 9 (charged particles) as strongly as the objective lens 8 is present, the ion beam 9 is directed toward the optical axis of the certain lens and deviates from the optical axis of the objective lens 8. In particular, when the acceleration voltage Va is reduced to 2 kV or less, the lens effect of the ion gun is abruptly increased, and the certain lens has a similar lens effect on the ion beam 9 to the objective lens 8. Thus, the lens effect of the certain lens cannot be ignored.

In order to adjust the axis of the beam in the focused ion beam apparatus, the position of the ion source (ion source) 1 is first adjusted so that the ion source (ion source) 1 is placed on the optical axis (extending through the center of the condenser lens 2) of the condenser lens 2. Next, the objective aperture (adjustable diaphragm) 3 is adjusted so that the center of the objective aperture (adjustable diaphragm) 3 is placed on the optical axis (extending through the center of the objective lens 8) of the objective lens 8. The adjustments are repeated so that the ion beam 9 is focused. Due to the adjustments, the following lines are placed on a single straight line: a line that connects the ion source 1 to the center (optical axis) of the condenser lens 2; and a line that connects the ion source 1, the center of the adjustable diaphragm and the center of the objective lens to each other. However, the single straight line is misaligned from the optical axis of the ion gun lens. In addition, when the lens of the ion gun is adjusted in the aforementioned state, the lens of the ion gun is misaligned from the other lenses.

Thus, it is highly likely that requirements for the passing of the ion beam vary depending on the accuracy of the optical axis of the lens that is constituted by the extracting electrode 13 and the earth electrode 15 that are included in the ion gun. As a measure, it is considered to select requirements for the passing of the ion beam on the basis of the accuracy of the optical axis of the lens of the ion gun. However, the requirements can be selected only when the ion beam is emitted. This method is very cumbersome and is not realistic. In addition, even if the lenses of the ion gun (extracting electrode 13 and the earth electrode 15) are recombined, misalignment may occur within a limit of mechanical accuracy. Thus, the accuracy of the axis is not necessarily improved. It is, therefore, necessary that a measure other than the aforementioned measure be taken to allow the ion beam 9 to pass when the acceleration voltage Va is in a range of 40 kV to 1 kV.

As described above, the divergence point is present when the acceleration voltage Va is in the range of 2 kV to 1 kV. The lens effect of the ion gun can be ignored when the acceleration voltage Va is in the range of 40 kV to 2 kV. However, when the acceleration voltage Va is 1 kV, the ion gun has a high lens effect so that a crossover is formed. In this case, when the optical axis of the lens constituted by the extracting electrode 13 and the earth electrode 15 is misaligned from the line that connects the ion source (LMIS) 1 to the center of the objective aperture 3, and the acceleration voltage Va is in a range from a value that causes the divergence point to be present to a value that causes a crossover to be formed on the upstream side of the objective aperture 3, the ion beam 9 is blocked by the objective aperture (adjustable diaphragm) 3 and cannot pass through the objective aperture 3.

When a crossover is formed on the upstream side of the objective aperture (adjustable diaphragm) 3, the crossover functions as a ion source to allow the ion beam 9 to propagate toward the objective aperture 3. Thus, even when the optical axis of the objective lens 8 is misaligned, the beam passes.

It was found out that the reason that a range in which the ion beam 9 passes varies depending on the extraction voltage Ve is that the focused state of the ion beam 9 is changed. In the ion gun according to the comparative example, however, the extraction voltage Ve and the vertical position h of the ion source (LMIS) 1 are changed in conjunction with each other. Thus, when the extraction voltage Ve is changed, the beam current Ib is largely changed. A problem that the ion beam 9 passes without a change in the beam current Ib is, therefore, not solved.

As is apparent from the aforementioned Equation 18, when the vertical position h of the ion source (LMIS) 1 is changed, Vco is changed and thereby ρ is changed.

In addition, the object point and the focal length are both changed, and the image forming point is also changed. Thus, the beam current Ib is changed. When the beam current Ib is increased, the resolution is reduced. When the beam current Ib is reduced, the resolution is increased. Thus, when the vertical position h of the ion source 1 is changed, a desired beam current Ib may not be obtained or desired resolution may not be obtained. Therefore, there is a problem that basic performance of the apparatus may be changed. Especially, when the acceleration voltage Va≅1 kV, it is difficult to obtain an ion beam 9 having a large current and a high current density.

(2-7) Consideration of Problem with Ion Gun According to Comparative Example

As described above, in the focused ion beam apparatus that includes the ion gun according to the comparative example, when the optical axis of the lens of the ion gun is slightly misaligned from the axis that extends through the center of the objective lens 8 and the center of the objective aperture 3, the ion beam 9 is deviated from the objective aperture 3 at a point near the divergence point of the ion gun and cannot pass through the objective aperture 3. In order to solve this problem, there is a method for changing the divergence point of the ion gun.

The following three methods can be considered as the method for changing the divergence point of the ion gun. The first method is to change the extraction voltage Ve. The second method is to change the distance h between the ion source (LMIS) 1 and the extracting electrode 13. The third method is to change a distance (interval) between the extracting electrode 13 and the earth electrode 15. The first and second methods can be used only by adjusting the focused ion beam (ion gun). In the third method, however, the performance of the lens of the ion gun is changed.

When the distance h between the ion source (LMIS) 1 and the extracting electrode 13 is reduced and the acceleration voltage Va is 2 kV or higher, the image magnification of the ion gun is reduced and the beam current is also reduced. Thus, this measure is not good. On the other hand, when the distance h between the ion source (LMIS) 1 and the extracting electrode 13 is increased and the acceleration voltage Va is 1 kV, the ion beam 9 forms a crossover. However, this measure is better even when the acceleration voltage Va≧2 kV. Thus, when the distance h between the ion source (LMIS) 1 and the extracting electrode 13 is increased, the extraction voltage Ve is increased and the beam current is affected by the increase in the extraction voltage Ve and thereby reduced.

Then, an increase and reduction in the beam current, which depend on characteristics of the lens (bipotential lens) of the ion gun, are considered below.

In FIGS. 7(a) and 7(b) described above, the following Equations 19 to 22 are obtained where the magnification is indicated by M; angular magnification is indicated by Mα; the positions of the main surfaces are indicated by Hi and Ho; the focal lengths are indicated by Fi and Fo; and the image forming points are indicated by a and b.

$$M = \frac{h_i}{h_o} = \frac{b - f_i}{a - f_o} = \frac{f_o \cdot \alpha_o}{f_i \cdot \alpha_i} = \frac{1}{M\alpha \cdot \rho} \quad \text{(Equation 19)}$$

$$\rho = \left(\frac{V_a}{V_e}\right)^{\frac{1}{2}} \quad \text{(Equation 20)}$$

$$M\alpha = \frac{\alpha_i}{\alpha_o} = -\frac{b}{a} \quad \text{(Equation 21)}$$

$$1 = \frac{f_i}{b} + \frac{f_o}{a} \quad \text{(Equation 22)}$$

For the lens (bipotential lens) of the ion gun, the following Equations 23 and 24 are obtained where the position of the ion source (LMIS) 1 is indicated by so using the position of the extracting electrode 13 as a reference; the image forming point is indicated by a (=Ho−(−so)) using the position so of the ion source 1; and the position of the focal point on the object point side is indicated by fo.

$$M = -\frac{f_o}{a - f_o} \quad \text{(Equation 23)}$$

$$\alpha_g = \frac{D_{ap}}{2 \cdot (a + (L_{ap} + Hi) \cdot M\alpha)} \quad \text{(Equation 24)}$$

$$(\because D_{ap}/2 = a * \alpha g + (Lap + Hi) * \alpha g * M\alpha)$$

The value Dap used in the aforementioned Equation 24 indicates the size (aperture diameter) of the objective aperture (adjustable diaphragm) 3. The value Lap indicates the distance between the extracting electrode 13 and the adjustable diaphragm 3 (refer to FIG. 5).

The value $\alpha g$ used in the aforementioned Equation 24 is a pure characteristic of the ion gun when the condenser lens 2 is not operated. In addition, the value $\alpha g$ is an opening angle of the ion beam that is emitted by the ion gun and restricted by the size Dap of the objective aperture 3. The value $\alpha g$ corresponds to the beam current.

Figure 14:
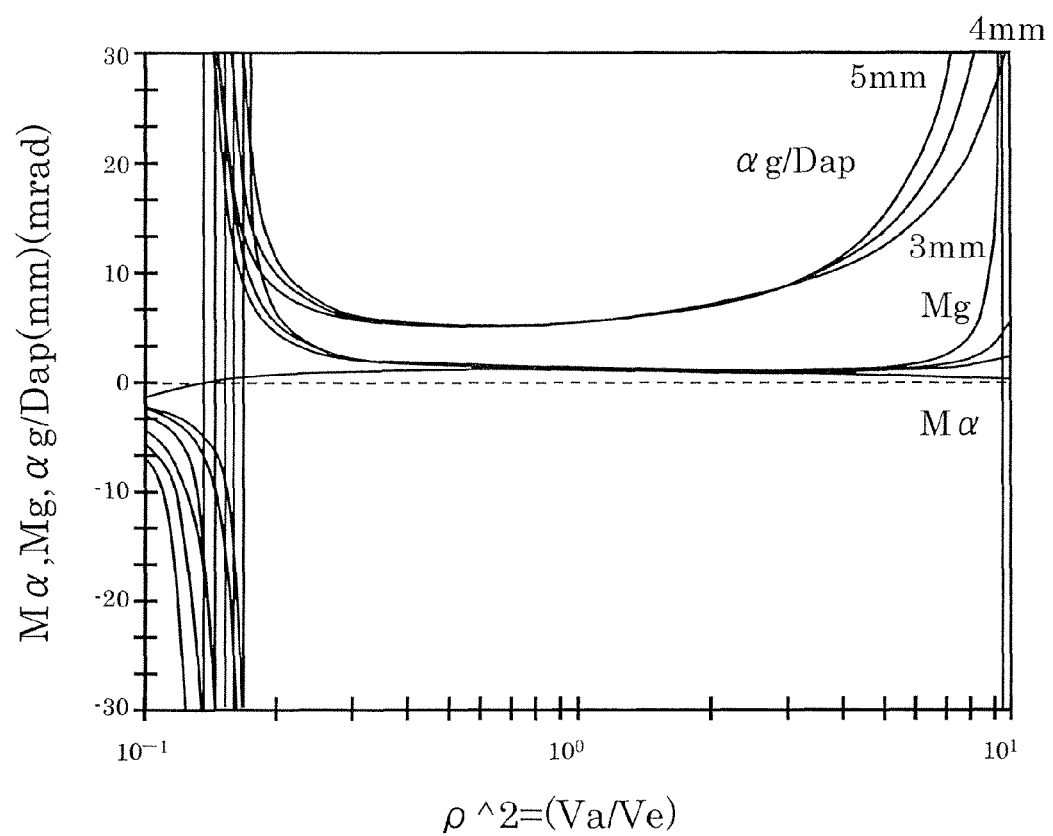
FIG. 14 is a diagram showing the relationships among ρ^2, angle magnification, and an opening angle of the beam.

FIG. 14 is a diagram showing the relationship between $\rho^2$ (=Va/Ve) and $M\alpha$, the relationship between $\rho^2$ and Mg, and the relationship between $\rho^2$ and $\alpha g$/Dap.

The divergence point of the bipotential lens is affected by the position so of the ion source (LMIS) 1 determined using the position of the extracting electrode 13 as the reference and the distance Lo between the extracting electrode 13 and the earth electrode 15. FIG. 14 shows the relationships when the distance Lo=8 mm (constant) and so=3, 4, and 5 mm. In the calculations, the extraction voltage Ve and the vertical position h of the ion source 1 are independent.

It is apparent that when the vertical position h of the ion source 1 is changed, the lens characteristic (refer to FIG. 14) of the ion gun with respect to $\rho$ is changed.

In FIG. 14, when $\Delta h<0$ and $\rho^2>1$, the value $\alpha g$ is reduced. In addition, when $\rho^2<1$ and $\rho$ is larger than the divergence point, the value $\alpha g$ is increased. However, when $\rho^2<1$ and $\rho$ is smaller than the divergence point, the value $\alpha g$ is reduced.

When $\Delta h>0$ and the ion gun is in a state in which the virtual ion source is formed, the ion source approaches the focal point due to the value $\Delta h$ that is larger than 0, and thereby the value $\alpha g$ is increased.

When $\Delta h>0$ and the ion gun is in a state in which a crossover is formed, the ion source becomes farther from the focal point due to the value $\Delta h$ that is larger than 0. When the ion gun is in a state in which a crossover is formed on the downstream side of the beam restricting aperture (restricting diaphragm) 14, the value $\alpha g$ is increased as the ion source is farther from the focal point. However, when the ion gun is in a state in which a crossover is formed on the upstream side of the beam restricting aperture (restricting diaphragm) 14, the value $\alpha g$ is reduced as the ion source is farther from the focal point.

(3) Charged Particle Gun According to the Present Embodiment

Figure 15:
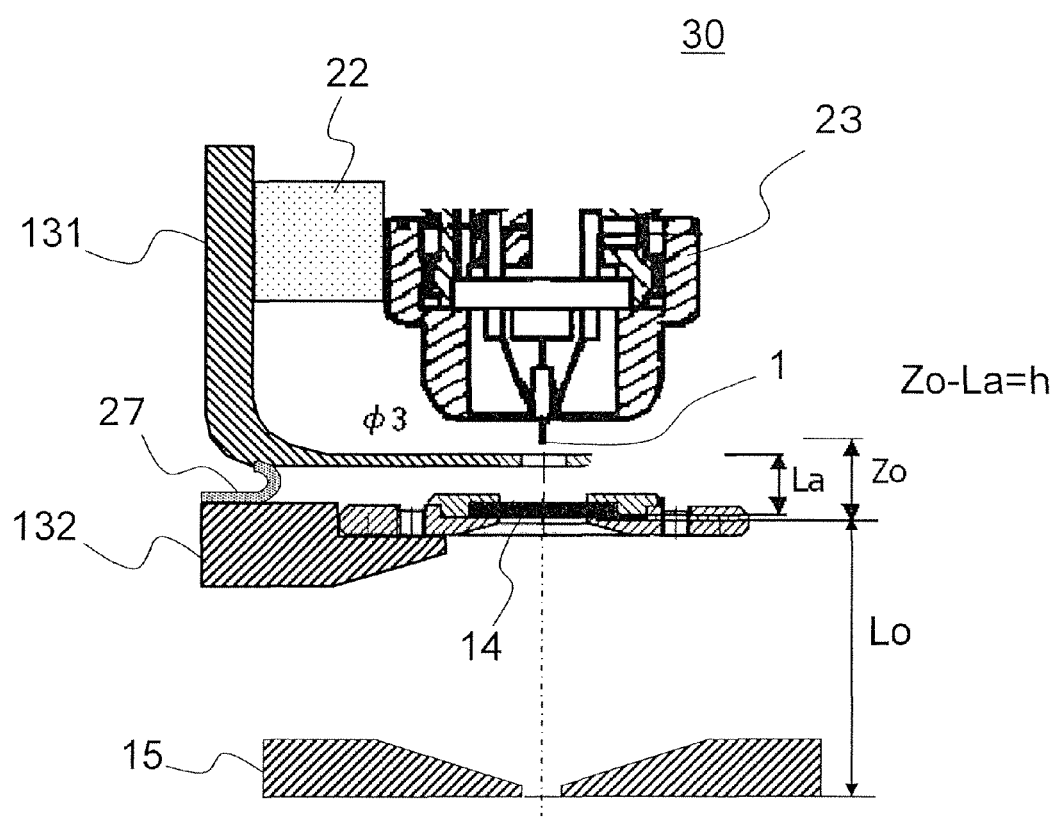
FIG. 15 is a diagram showing a charged particle gun according to the embodiment.

FIG. 15 is a diagram showing the charged particle gun (ion gun) according to the present embodiment.

In FIG. 15, the charged particle gun according to the present embodiment includes: the ion source (LMIS) 1, a first extracting electrode 131 arranged in such a manner that a distance between the ion source 1 and the first extracting electrode 131 is fixed; the second extracting electrode 132 located on the side opposite to the ion gun 1 with respect to the first extracting electrode 131, the electrode 132 being arranged in such a manner that a distance between the first and second extracting electrodes 131 and 132 is adjustable; the earth electrode 15 located on the side opposite to the first extracting electrode 131 with respect to the second extracting electrode 132, the electrode 15 being arranged in such a manner that a distance between the second extracting electrode 132 and the earth electrode 15 is fixed; and a stretchable connector 27 that electrically connects the first extracting electrode 131 to the second extracting electrode 132 so that the first extracting electrode 131 is equal in potential to the second extracting electrode 132.

An outer circumferential portion of the first extracting electrode 131 has a holding section that is located on the side (upstream side) of the ion source 1 and surrounds the LMIS holder 23.

The ion source (LMIS) 1 is held by the LMIS holder 23. The LMIS holder 23 is held by the holding section of the first extracting electrode 131 through an insulator 22. Thus, the ion source 1 is fixed to the first extracting electrode 131.

The second extracting electrode 132 and the earth electrode 15 are fixed to a common holding member (not shown) through an insulator or the like. The positional relationship between the second extracting electrode 132 and the earth electrode 15 is fixed.

The first extracting electrode 131 is held by a holding member (not shown) so as to be driven. The first extracting electrode 131 is driven by a driving device (not shown). Thus, the driving device drives the ion source 1 and the first extracting electrode 131 in a unified manner with respect to the second extracting electrode 132 and the earth electrode 15.

The connector 27 has a stretching property or a length that is sufficient to allow the first extracting electrode 131 to move relative to the second extracting electrode 132 while the first and second extracting electrodes are electrically connected to each other. For example, the connector 27 is a plate spring made of a conductive material, a spring made of a conductive material, or a conducting wire that has a length that is sufficient to allow the first extracting electrode 131 to move relative to the second extracting electrode 132, or the like. Since the first extracting electrode 131 is set equal in potential to the second extracting electrode 132 by the connector 27, a space between the first extracting electrode 131 and the second extracting electrode 132 is an equipotential space.

In the ion gun according to the present embodiment configured as described above, the position of the ion source 1 can be changed without a change in the positional relationship (distance h) between the extracting electrode (first extracting electrode 131) and the ion source (LMIS) 1. In other words, the ion source 1 and the first extracting electrode 131 move in a unified manner. This configuration suppresses a change in the intensity of the electric field that is applied to the ion source 1 due to a change in the distance Zo between the ion source 1 and the extracting electrode (second extracting electrode 132). In addition, since the vertical position (distance) h is not changed, the threshold voltage Vco is not changed according to the aforementioned Equation 18. Thus, $\rho^2$ (=Va/Ve) is also not changed (however, the extraction voltage Ve≅the threshold voltage Vco).

The positional relationship between the second extracting electrode 132 and the earth electrode 15 that constitute the lens of the ion gun is fixed. This positional relationship suppresses an increase in astigmatism caused by misalignment of the optical axis of the electrostatic lens that needs to have a high-accuracy optical axis and allows the ion beam 9 to be focused. In addition, characteristics (the focal length of the bipotential lens and the like) of the lens of the ion gun are not changed due to a change in the distance Lo between the extracting electrode (second extracting electrode 132) and the earth electrode 15. Thus, it is not necessary to perform a recalculation in order to consider performance of the beam and the like.

The space located between the first extracting electrode 131 and the second extracting electrode 132 is the equipotential space. Charged particles move at a constant speed in the space (drift space). An image point of the object point (ion source 1) is changed by changing the distance (distance of the drift space) La between the first extracting electrode 131 and the second extracting electrode 132. In addition, the beam current is changed by changing the magnification of the lens of the ion gun.

(3-2) Effects of the Present Embodiment

Effects of the present embodiment configured as described above are compared with the case in which the ion gun according to the comparative example is used. The effects of the present embodiment are described below.

In the focused ion beam apparatus that includes the ion gun according to the comparative example, ρ is changed when the vertical position of the ion source with respect to the extracting electrode 13 is changed.

On the other hand, in the charged particle gun (ion gun) according to the present embodiment and the focused ion beam apparatus that includes the charged particle gun (ion gun) according to the present embodiment, ρ is constant even when the vertical position Zo of the ion source (LMIS) 1 with respect to the extracting electrode 132 is changed. In addition, the focal point of the lens of the ion gun is not changed. Thus, when the position Zo of the object point is changed, only the magnification of the ion gun is changed. The beam current is changed by changing the magnification of the ion gun. Thus, the beam current can be adjusted.

Changing the vertical position Zo of the ion source (LMIS) 1 to increase the distance Zo when the acceleration voltage Va is 40 kV corresponds to the fact that the ion source (LMIS) 1 approaches the focal point f of the ion gun. It is apparent from the aforementioned Equation 23 that the magnification M is increased and the virtual ion source of the image point approaches the divergence point. Thus, the current density of the beam with which the adjustable diaphragm 3 is irradiated is increased, and the beam current is increased.

In addition, when the acceleration voltage 1 kV, the lens effect of the ion gun is very large and the focal length (distance between the focal point f and the ion source 1) is short. Thus, changing the vertical position Zo of the LMIS 1 to increase the distance Zo when the acceleration voltage Va is 1 kV corresponds to the fact that the LMIS 1 becomes farther from the focal point f. It is apparent from the aforementioned Equation 23 that the magnification M is reduced and a crossover of the image point approaches the side of the LMIS 1. Thus, a crossover that is located on the downstream side of the objective (adjustable) diaphragm 3 is moved toward the upstream side of the objective diaphragm 3 so that the beam can pass.

In addition, in the ion gun according to the comparative example, when the acceleration voltage Va is in a range of 40 kV to 2 kV and the distance between the LMIS 1 and the first extracting electrode 13 is increased ($\Delta h>0$), the extraction voltage Ve is increased ($\Delta Ve>0$). As a result, the beam current is reduced. In addition, when the acceleration voltage Va is 1 kV, the beam current is also reduced.

On the other hand, in the present embodiment, only the vertical position h of the ion source 1 can be changed ($\Delta h \neq 0$) without a change in the extraction voltage Ve ($\Delta Ve=0$). When the acceleration voltage Va is in a range of 40 kV to 2 kV and the distance h between the ion source (LMIS) 1 and the first extracting electrode 131 is increased ($\Delta h>0$), the extraction voltage Ve is almost unchanged ($\Delta Ve \cong 0$). Since the ion source becomes close to the focal point, the magnification M can be increased so that the beam current is increased.

FIG. 16 shows changes in the beam current when the extraction voltage Ve and the vertical position h of the ion source 1 are changed.

FIG. 16 shows magnitude relationships between the beam current when the extraction voltage Ve is reduced ($\Delta Ve<0$) and the beam current when the extraction voltage Ve is increased ($\Delta Ve>0$) for each of acceleration voltages Va. FIG. 16 also shows magnitude relationships between the beam current when the distance h between the ion source 1 and the first extracting electrode 131 is reduced ($\Delta h<0$) and the beam current when the distance h between the ion source 1 and the first extracting electrode 131 is increased ($\Delta h>0$) for each of the acceleration voltages Va.

When the acceleration voltage is 40 kV, and the distance between the first extracting electrode 131 and the second extracting electrode 132 is increased in addition to the reduction in the distance Lap or (Lap−lap), the beam current density of the ion beam to which the acceleration voltage of 25 kV or more is applied can be further increased.

In the ion gun according to the comparative example, when the extraction voltage Ve=7.0±0.25 kV, the apparatus can be used as a large current/high current density beam apparatus. However, in the ion gun according to the comparative example, when the extraction voltage Ve=7.0±0.25 kV and the acceleration voltage Va is 1 kV, the beam does not pass. When the extraction voltage Ve=7.5 kV and the acceleration voltage Va=1 kV, the beam can pass. In this case, however, the beam current is reduced. Thus, in the focused ion beam apparatus according to the comparative example, when the acceleration voltage Va is low, a large current and a high current density of the beam cannot be obtained.

On the other hand, in the ion gun according to the present embodiment, the distance h between the ion source 1 and the first extracting electrode 131 can be increased while the extraction voltage Ve is set to 7 kV and unchanged. Thus, the crossover that functions as the ion source is moved and located on the upstream side of the objective (adjustable) diaphragm 3 so that the adjustable diaphragm 3 does not block the ion beam or the beam can pass through the adjustable diaphragm 3. When the acceleration voltage Va is 40 kV, the magnification of the ion gun is increased and the beam current is increased. Thus, the extraction voltage Ve can be increased by a value that corresponds to the increase in the beam current. Therefore, even when the acceleration voltage Va is low and the extraction voltage Ve=7.5 kV, a large current and a high current density of the beam can be obtained in the focused ion beam apparatus.

DESCRIPTION OF THE REFERENCE NUMERALS

1 Charged particle source (ion source)
2 Electrostatic lens (condenser lens)
3 Objective aperture (diaphragm device)
4 Aligner/stigma
5 Blanker
6 Blanking plate
7 Beam scanner
8 Objective lens
9 Ion beam
10 Sample
11 Sample stage
12 Detector
13 Extracting electrode
14 Beam restricting aperture
15 Earth electrode
17 Condenser electrode
18 Ring-shaped disk having screw portion
19 Cylindrical member having screw portion
20 Ion source insulator
21 Bellows
22, 25 Holding member
23 LMIS holder
24 Voltage terminal
26 Insulator
81 Incident side electrode
82 Intermediate electrode 83 Outgoing side electrode
131 First extracting electrode
132 Second extracting electrode

The invention claimed is:

1. A charged particle gun comprising:
a charged particle source;
a first extracting electrode arranged in such a manner that a distance between the charged particle source and the first extracting electrode is fixed;
a second extracting electrode located on the side opposite to the charged particle source with respect to the first extracting electrode, the second extracting electrode being arranged in such a manner that a distance between the first extracting electrode and the second extracting electrode is adjustable; and
an earth electrode located on the side opposite to the first extracting electrode with respect to the second extracting electrode, the earth electrode being arranged in such a manner that a distance between the second extracting electrode and the earth electrode is fixed;
wherein the first extracting electrode is equal in potential to the second extracting electrode.

2. The charged particle gun according to claim 1, further comprising a stretchable connector, the connector electrically connecting the first extracting electrode to the second extracting electrode so that the first extracting electrode is equal in potential to the second extracting electrode.

3. The charged particle gun according to claim 1 or 2, wherein the charged particle source is an ion source.

4. A focused ion beam apparatus comprising:
the charged particle gun according to claim 3;
a condenser lens that focuses a charged particle beam emitted from the charged particle gun; and
an objective lens;
wherein the ion source is a gallium liquid metal ion source.

5. The focused ion beam apparatus according to claim 4, wherein the distance between the second extracting electrode and the earth electrode is in a range of 6 mm to 8 mm, and the distance between the first extracting electrode and the second extracting electrode is 5 mm or more.

* * * * *